United States Patent
Okuno et al.

(10) Patent No.: US 9,209,021 B2
(45) Date of Patent: Dec. 8, 2015

(54) METHOD FOR PRODUCING GROUP III NITRIDE SEMICONDUCTOR AND GROUP III NITRIDE SEMICONDUCTOR

(71) Applicant: TOYODA GOSEI CO., LTD., Kiyosu (JP)

(72) Inventors: Koji Okuno, Kiyosu (JP); Takahide Oshio, Kiyosu (JP); Naoki Shibata, Kiyosu (JP); Hiroshi Amano, Nagoya (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/290,684

(22) Filed: May 29, 2014

(65) Prior Publication Data

US 2014/0353804 A1    Dec. 4, 2014

(30) Foreign Application Priority Data

May 31, 2013    (JP) .................... 2013-116162

(51) Int. Cl.
*H01L 21/00*   (2006.01)
*H01L 29/06*   (2006.01)
(Continued)

(52) U.S. Cl.
CPC ...... *H01L 21/02609* (2013.01); *H01L 21/0242* (2013.01); *H01L 21/0243* (2013.01); *H01L 21/0254* (2013.01); *H01L 21/0262* (2013.01);
(Continued)

(58) Field of Classification Search
CPC .............. H01L 21/02609; H01L 21/0254; H01L 29/045; H01L 29/2003; H01L 29/04

USPC .............. 438/22–29, 34, 39, 41–47; 257/618, 257/622, 623, 627, 628

See application file for complete search history.

(56) References Cited

U.S. PATENT DOCUMENTS 8,367,445 B2 * 2/2013 Okuno ........................ 438/39
8,680,581 B2   3/2014 Nakada et al.
(Continued)

FOREIGN PATENT DOCUMENTS

JP   2000-106455 A   4/2000
JP   2003-526907 A   9/2003
(Continued)

OTHER PUBLICATIONS

Japanese Office Action dated Jan. 20, 2015 with a partial English translation thereof.

(Continued)

*Primary Examiner* — Hsien Ming Lee
(74) *Attorney, Agent, or Firm* — McGinn IP Law Group, PLLC.

(57) ABSTRACT

A first side surface of post of the first stripe is formed so that a plane which is most parallel to the first side surface among low-index planes of the growing Group III nitride semiconductor is a m-plane (10-10), and a first angle between the first lateral vector obtained by orthogonally projecting a normal vector of the first side surfaces to the main surface and a m-axis projected vector obtained by orthogonally projecting a normal vector of the m-plane of the growing semiconductor to the main surface is from 0.5° to 6°. A second side surface of post of the second stripe is formed so that a plane which is most parallel to the second side surface among low-index planes of the growing semiconductor is an a-plane (11-20), and a second angle between the second lateral vector and an a-axis projected vector of the a-plane is from 0° to 10°.

20 Claims, 20 Drawing Sheets

(51) Int. Cl.
*H01L 29/04* (2006.01)
*H01L 21/02* (2006.01)
*H01L 29/20* (2006.01)

(52) U.S. Cl.
CPC .... *H01L 21/02378* (2013.01); *H01L 21/02381* (2013.01); *H01L 21/02433* (2013.01); *H01L 21/02458* (2013.01); *H01L 21/02576* (2013.01); *H01L 21/02579* (2013.01); *H01L 29/045* (2013.01); *H01L 29/2003* (2013.01)

(56) References Cited

U.S. PATENT DOCUMENTS

| | | |
|---|---|---|
| 2003/0057444 A1 | 3/2003 | Niki et al. |
| 2003/0145783 A1 | 8/2003 | Motoki et al. |
| 2004/0020642 A1 | 2/2004 | Vinegar et al. |
| 2005/0001227 A1 | 1/2005 | Niki et al. |
| 2005/0179130 A1 | 8/2005 | Tanaka et al. |
| 2008/0303043 A1 | 12/2008 | Niki et al. |
| 2009/0042328 A1 | 2/2009 | Niki et al. |
| 2009/0197118 A1 | 8/2009 | Nagai et al. |
| 2010/0197055 A1 | 8/2010 | Tanaka et al. |
| 2010/0264445 A1 | 10/2010 | Niki et al. |
| 2010/0264446 A1 | 10/2010 | Niki et al. |
| 2010/0264447 A1 | 10/2010 | Niki et al. |
| 2010/0266815 A1 | 10/2010 | Niki et al. |
| 2010/0267181 A1 | 10/2010 | Niki et al. |
| 2013/0256743 A1* | 10/2013 | Okuno et al. .............. 257/103 |

FOREIGN PATENT DOCUMENTS

| | | |
|---|---|---|
| JP | 2003-318441 A | 11/2003 |
| JP | 2004-200523 A | 7/2004 |
| JP | 2005-101566 A | 4/2005 |
| JP | 2010-168274 A | 8/2010 |
| JP | 2011-077265 A | 4/2011 |
| JP | 2012-114204 A | 6/2012 |
| WO | WO 01/59819 A1 | 8/2001 |

OTHER PUBLICATIONS

United States Office Action dated Jul. 21, 2015 in co-pending U.S. Appl. No. 13/845,453.

* cited by examiner

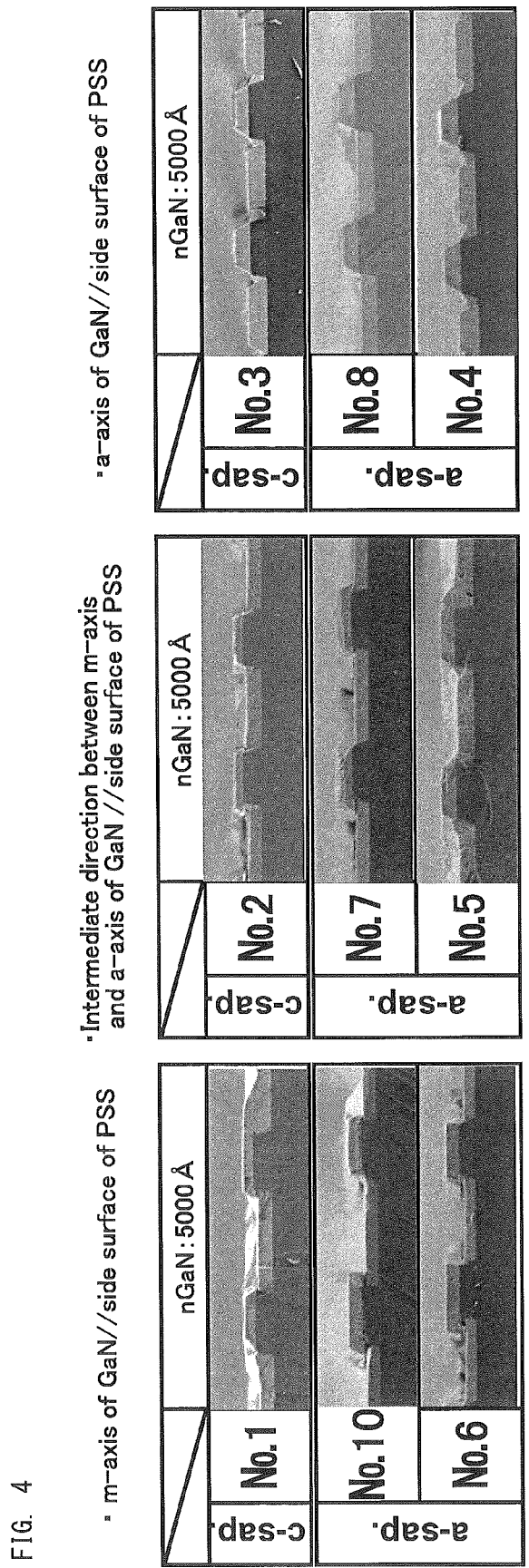

FIG. 9B

Dislocations are uniformly distributed.

Dislocation density
$3.6 \times 10^8$ cm$^{-2}$

Dislocations are locally distributed.

Dislocation density
$4.2 \times 10^8$ cm$^{-2}$

SiC substrate

Si substrate

METHOD FOR PRODUCING GROUP III NITRIDE SEMICONDUCTOR AND GROUP III NITRIDE SEMICONDUCTOR

BACKGROUND OF THE INVENTION

1. Field of the Invention

The present invention relates to a method for growing Group III nitride semiconductor crystal on a concave-convex substrate and a Group III nitride semiconductor.

2. Background Art

When a Group III nitride semiconductor light-emitting device is produced by crystal growth of Group III nitride semiconductor on a sapphire substrate, a technique has been developed to form concaves and convexes on a Group III nitride semiconductor growing surface of the sapphire substrate to improve the light extraction performance (e.g. Japanese Patent Application Laid-Open (kokai) Nos. 2004-200523 and 2005-101566).

Japanese Patent Application Laid-Open (kokai) No. 2003-526907 discloses that concaves and convexes are formed in the form of stripes on a sapphire substrate, GaN is vertically grown on the top surfaces of the posts, and further laterally grown, thereby obtaining a GaN semiconductor having a low threading dislocation density.

However, when Group III nitride semiconductor is grown on the concave-convex sapphire substrate by these methods, voids are formed near the side surfaces of the trenches or posts, resulting in a problem that crystallinity and flatness of Group III nitride semiconductor are deteriorated.

Therefore, Japanese Patent Application Laid-Open (kokai) No. 2003-318441 discloses that sides in planar view of trenches or posts intersect with an a-plane of a sapphire substrate. When the trenches or posts are formed in such a manner, GaN is grown on the top surfaces of the posts of the sapphire substrate and the bottom surfaces of the trenches, and GaN is difficult to grow on side surfaces of the trenches or posts. As the growth progresses, the crystals are combined together, thereby obtaining GaN having superior crystallinity and high flatness, with no void formed therein. On the other hand, when sides in planar view of trenches or posts are parallel to an a-plane of a sapphire substrate, lateral growth of the GaN grown on the trenches or posts is slow. Therefore, the vicinity of the side surfaces of the trenches or posts is difficult to be filled with GaN, and the surface flatness of GaN is deteriorated.

Japanese Patent Application Laid-Open (kokai) No. 2011-77265 discloses that all side surfaces of posts on a substrate having an a-plane or c-plane main surface are the surfaces which inhibit the crystal growth of Group III nitride semiconductor. It is also disclosed that when the posts are hexagonal prisms, the angle between each side of hexagons in planar view and the m-axis is 15°.

When the posts or trenches are formed in a unidirectional stripe pattern, light propagated along this stripe direction fail to be scattered, resulting in insufficient improvement of external quantum efficiency. Japanese Patent Application Laid-Open (kokai) No. 2012-114204 discloses that a first stripe structure is formed in a first axis direction, and the first stripe structure is etched in a second axis direction crossing the first axis direction so that the second stripe structure is overlapped on the first stripe structure, thereby four differences in level are provided. Thus, the light propagated in parallel to the first stripe structure is scattered by the second stripe structure, resulting in the improvement of external quantum efficiency. However, as in Japanese Patent Application Laid-Open (kokai) No. 2012-114204, when a Group III nitride semiconductor is grown on a surface having posts or trenches arranged in a grid pattern, Group III nitride semiconductor is grown in a complicated growth mode because crystal orientation is different between the side surface of the first stripe structure and the side surface of the second stripe structure. Therefore, there is a problem that threading dislocations are locally distributed, resulting in the reduction of the internal quantum efficiency and the yield ratio of production.

SUMMARY OF THE INVENTION

In view of the foregoing, an object of the present invention is to obtain a method for producing a Group III nitride semiconductor with good crystal quality and uniform threading dislocation density even on a concave-convex substrate where a second stripe structure is overlapped on a first stripe structure by forming the first stripe structure in a first axis direction and etching the first stripe structure in a second axis direction crossing the first axis direction, and a semiconductor with good crystal quality while having the same concave-convex structure as that of the substrate.

In a first aspect of the present invention, there is provided a method for producing a Group III nitride semiconductor comprising forming a concave-convex structure including posts and trenches on a main surface of a substrate, and growing Group III nitride semiconductor in a c-axis direction of the Group III nitride semiconductor on the top surfaces of the posts and the bottom surfaces of the trenches, wherein forming the concave-convex structure comprising forming a first stripe structure and a second stripe structure on the main surface of the substrate, the first stripe structure including a plurality of first grooves which are arranged in a stripe pattern as viewed from above and are aligned parallel to the first direction, the second stripe structure including a plurality of second grooves which are arranged in a stripe pattern as viewed from above and are aligned parallel to the second direction crossing the first direction, so that a difference in level is formed by the depth of the second groove in the first groove and a difference in level is formed by the depth of the first groove in the second groove;

a first processed side surface which is a side surface of the post or the trench of the first stripe structure is formed so as to satisfy the following conditions:

a plane which is most parallel to the first processed side surface among low-index planes of the growing Group III nitride semiconductor is a m-plane (10-10); and when a projected vector obtained by orthogonally projecting a normal vector of the first side surface to the main surface of the substrate is defined as a first lateral vector, a first angle formed by the first lateral vector and a m-axis projected vector obtained by orthogonally projecting a normal vector of the m-plane of the growing Group III nitride semiconductor to the main surface is from 0.5° to 6°; and a second processed side surface which is a side surface of the post or the trench of the second stripe structure is formed so as to satisfy the following conditions:

a plane which is most parallel to the second processed side surface among low-index planes of the growing Group III nitride semiconductor is an a-plane (11-20); and when a projected vector obtained by orthogonally projecting a normal vector of the second side surface to the main surface is defined as a second lateral vector, a second angle formed by the second lateral vector and an a-axis projected vector obtained by orthogonally projecting a normal vector of the a-plane of the growing Group III nitride semiconductor to the main surface is from 0° to 10°.

The above first and second angles are defined as a smaller angle (within a range of 90° or less) of the angles formed by two vectors. The first stripe structure and the second stripe structure may be formed in any order. After the first stripe structure including the posts and the first grooves was formed, the second stripe structure including the posts and the second grooves may be formed on the first stripe structure. On the contrary, after the second stripe structure including the posts and the second grooves was formed, the first stripe structure including the posts and the first grooves may be formed on the second stripe structure. In both orders, a difference in level is provided by the depth of the second groove in the first groove and a difference in level is provided by the depth of the first groove in the second groove. A difference in level refers to a depth between the portions remained and removed by etching in forming the first stripe structure and the second stripe structure. The substrate may be formed of a material having any crystal structure as long as Group III nitride semiconductor is grown in the c-axis direction of the Group III nitride semiconductor on the top surfaces of the posts and the bottom surfaces of the trenches. For example, a substrate formed of at least one of a group consisting of sapphire, SiC, Si, and ZnO, a Group III nitride semiconductor such as GaN, an AlN substrate or a template substrate in which an epitaxial layer of Group III nitride semiconductor such as GaN is formed on a substrate made of any material, may be used. When the template substrate is used, the concave-convex structure may be formed only on the epitaxial layer or so as to extend from the epitaxial layer to the substrate. The first stripe structure and the second stripe structure are formed by etching the substrate, both structures are periodically arranged and have posts and trenches. The second stripe structure or the first stripe structure is formed by etching the first stripe structure or the second stripe structure in a stripe pattern in a direction where the projections are crossing one another on the main surface to form the second grooves or the first grooves. Therefore, the concave-convex structure has three or four differences in level. Thus, when the first groove of the first stripe structure and the second groove of the second stripe structure have the same depths, three differences in level are provided. When they have different depths, four differences in level are provided.

The first processed side surface and the second processed side surface (hereinafter, when there is no need to distinguish between the first processed side surface and the second processed side surface, they are simply referred to as the processed side surface) of the posts or the trenches may be perpendicular to the main surface of the substrate, but there may be an inclination caused by etching or an intentional inclination. Moreover, each processed side surface may comprise a curved plane formed by arranging a plurality of planes, each of which has different normal vector, in a vertical direction. The side surface may comprise a curved surface whose vertical cross section is arc-shaped, ellipse-shaped, parabola-shaped, or other curve-shaped. The processed side surface that can be considered as one plane is not necessarily a straight line along a direction parallel to the main surface of the substrate. One planar processed side surface may be a curve or inflected line.

In the present invention, projected vectors obtained by orthogonally projecting the normal vector of the first processed side surface and the second processed side surface to the main surface are respectively defined as a first lateral vector and a second lateral vector, considering the case where the processed side surface of the post is not perpendicular to the main surface. That is, an inclination angle of the processed side surface from the surface perpendicular to the main surface is not included in the angle disclosed in the present invention. A c-axis of Group III nitride semiconductor growing in a direction perpendicular to the main surface on the top surfaces of the posts and the bottom surfaces of the trenches is basically perpendicular to the main surface, but may be slightly inclined. A m-plane (10-10) or a plane (10-1x) (x is an integer) inclined from the m-plane as a terrace and an a-plane (11-20) or a plane (11-2y) (y is an integer) inclined from the a-plane as a step are formed along the first direction on the side surfaces parallel to the first processed side surface of the growing Group III nitride semiconductor. When the second processed side surface is not parallel to the a-plane of the growing Group III nitride semiconductor (the second angle is not 0°), an a-plane terrace and a m-plane step are formed on the side surface parallel to the second processed side surface of the growing Group III nitride semiconductor. An angle between the m-plane (10-10) and the a-plane (11-20) of Group III nitride semiconductor is 90° or 30° (150°). The growth of Group III nitride semiconductor is slow in the m-axis direction and fast in the a-axis direction. When one planar processed side surface is not a single plane, the normal vector on one processed side surface is defined as an average of normal vectors. That is, an average of normal vector surface integrals is defined as a normal vector of one side surface.

The first characteristic of the present invention is that the orientation of the processed side surface is determined so that the angle between the first lateral vector obtained by orthogonally projecting the normal vector of the first processed side surface to the main surface and a m-axis projected vector obtained by orthogonally projecting the normal vector of the m-plane of the growing Group III nitride semiconductor to the main surface falls within a range of 0.5° to 6'. Moreover, the second characteristic of the present invention is that the orientation of the processed side surface is determined so that the angle between the second lateral vector obtained by orthogonally projecting the normal vector of the second processed side surface to the main surface and an a-axis projected vector obtained by orthogonally projecting the normal vector of the a-plane of the growing Group III nitride semiconductor to the main surface falls within a range of 0° to 10°.

When the side surface of Group III nitride semiconductor growing in the c-axis direction perpendicular to the main surface of the substrate on the top surfaces of the posts and the bottom surfaces of the trenches is the m-plane, Group III nitride semiconductor is facet grown so as to have a triangle cross section. Threading dislocation is bent laterally through facet growth, and the threading dislocation density is reduced on the upper surface of the grown semiconductor layer. However, unless Group III nitride semiconductor is also grown in a direction parallel to the main surface, a space among the facets cannot be filled with Group III nitride semiconductor.

In the present invention, the plane of the growing Group III nitride semiconductor which is perpendicular to the first lateral vector of the first processed side surface (also perpendicular to the main surface), is rotated within a range of 0.5° to 6° from the m-plane of the Group III nitride semiconductor around an axis perpendicular to the substrate. If the c-axis is completely perpendicular to the main surface, the side surface of Group III nitride semiconductor (perpendicular to the main surface) is a plane rotated from the m-plane within a range of 0.5° to 6° around the c-axis, that is, a plane crossing the m-plane at an angle of 0.5° to 6°. Here, the range is satisfied in the both directions of a clockwise and a counterclockwise. Therefore, the a-axis projected vector obtained by orthogonally projecting the normal vector of the a-plane of the growing Group III nitride semiconductor (the a-plane is perpendicular to the m-plane and parallel to the c-axis) to the main surface has a component in a direction of the first lateral vector. As a result, Group III nitride semiconductor grows in a direction parallel to the main surface and perpendicularly to the first processed side surface. Thus, lateral growth parallel to the main surface is achieved in addition to vertical growth in the c-axis direction, thereby filling the differences in level caused by forming the concave-convex structure without changing the vertical growth conditions.

With respect to the second processed side surface, the second angle between the second lateral vector and an a-axis projected vector obtained by orthogonally projecting the normal vector of the a-plane of the growing Group III nitride semiconductor is from 0° to 10°. If the c-axis is completely perpendicular to the main surface, the side surface of Group III nitride semiconductor, which is perpendicular to the second lateral vector (perpendicular to the main surface) is a plane rotated from the a-plane within a range of 0° to 10° around the c-axis, that is, a plane crossing the a-plane at an angle of 0° to 10°. Here, the range is satisfied in the both directions of a clockwise and a counterclockwise. Therefore, the a-axis projected vector obtained by orthogonally projecting the normal vector of the a-plane of the growing Group III nitride semiconductor (the a-plane is perpendicular to the m-plane and parallel to the c-axis) to the main surface has a larger component in a direction of the second lateral vector. As a result, Group III nitride semiconductor grows in a direction parallel to the main surface and perpendicularly to the second processed side surface. Thus, lateral growth parallel to the main surface is achieved in addition to vertical growth in the c-axis direction, thereby filling the differences in level caused by forming the concave-convex structure of the first stripe structure and the second stripe structure crossing each other without changing the vertical growth conditions.

The first angle θ1 range of 0.5° to 6° and the second angle θ2 range of 0° to 10° are satisfied in the both directions of a clockwise and a counterclockwise. Thus, they are defined as absolute values. Therefore, the second angle range of −10° to 10° can correspond to the first angle range of −6° to −0.5°, including the rotational direction symbols. The second angle range of −10° to 10° can correspond to the first angle range of 0.5° to 6°. Thus, for the m-plane and the a-plane which are crossing each other, an angle (smaller angle) between the first lateral vector and the second lateral vector falls within a range of 74° to 90°. An angle between the m-plane and the a-plane may be 30° (150°). In this case, an angle (smaller angle) between the first lateral vector and the second lateral vector falls within a range of 14° to 46°.

With such a growth method, threading dislocation is suppressed from being distributed at a high density in the vicinity of a boundary between the trenches and the posts, and the threading dislocation density can be uniform on the uppermost surface of the growing semiconductor layer. The present invention is based on the above idea.

In the above invention, when a substrate with a hexagonal crystal structure is used, the following embodiments are given. The main surface of the substrate is a c-plane of hexagonal crystal, and the angle between the first lateral vector of the first processed side surface and an a-axis projected vector obtained by orthogonally projecting a normal vector of a-plane (11-20) of hexagonal crystal to the main surface can be from 0.5° to 6°. Moreover, the angle between the second lateral vector of the second processed side surface and a m-axis projected vector obtained by orthogonally projecting a normal vector of m-plane (10-10) of hexagonal crystal to the main surface can be from 0° to 10°.

In this case, the a-plane and the m-plane of hexagonal crystal in the substrate are parallel to, respectively, the m-plane and the a-plane of the growing Group III nitride semiconductor. Therefore, the angle between the first lateral vector of the first processed side surface and the m-axis projected vector obtained by orthogonally projecting the normal vector of the m-plane of the growing Group III nitride semiconductor to the main surface can be from 0.5° to 6°. The angle between the second lateral vector of the second processed side surface and the a-axis projected vector obtained by orthogonally projecting the normal vector of the a-plane of the growing Group III nitride semiconductor to the main surface can be from 0° to 10°.

That is, the plane of the Group III nitride semiconductor which is perpendicular to the first lateral vector of the first processed side surface is a plane rotated from the m-plane of Group III nitride semiconductor within a range of 0.5° to 6° around the c-axis. The plane of the Group III nitride semiconductor which is perpendicular to the second lateral vector of the second processed side surface is a plane rotated from the a-plane of Group III nitride semiconductor within a range of 0° to 10° around the c-axis. Here, the range is satisfied in the both directions of a clockwise and a counterclockwise. Such a relationship between the crystal orientation of the substrate and the crystal orientation of the growing Group III nitride semiconductor is established for the hexagonal crystal substrate having a different lattice constant from that of Group III nitride semiconductor. A representative example of such hexagonal crystal substrate is a sapphire substrate. A SiC substrate and a ZnO substrate have a hexagonal crystal structure. However, the crystal orientation of the substrate coincides with the crystal orientation of the growing Group III nitride semiconductor in the same as when Group III nitride semiconductor is grown on the Group III nitride semiconductor substrate.

The main surface of the substrate may be an a-plane of hexagonal crystal. The first angle between the first lateral vector and the c-axis projected vector obtained by orthogonally projecting the normal vector of the c-plane (0001) of hexagonal crystal of the substrate to the main surface can be from 0.5° to 6°. The second angle between the second lateral vector and the m-axis projected vector obtained by orthogonally projecting the normal vector of the m-plane (10-10) of hexagonal crystal of the substrate to the main surface can be from 0° to 10°.

In this case, since the m-plane of hexagonal crystal of the substrate is parallel to the a-plane of Group III nitride semiconductor, the c-plane of hexagonal crystal of the substrate is parallel to the m-plane of Group III nitride semiconductor. Therefore, the first angle between the first lateral vector of the first processed side surface and the m-axis projected vector obtained by orthogonally projecting the normal vector of the m-plane of the growing Group III nitride semiconductor to the main surface can be from 0.5° to 6°. The second angle between the second lateral vector of the second processed side surface and the a-axis projected vector obtained by orthogonally projecting the normal vector of the a-plane of the growing Group III nitride semiconductor to the main surface can be from 0° to 10°.

That is, the plane of the Group III nitride semiconductor which is perpendicular to the first lateral vector, can be a plane rotated from the m-plane of Group III nitride semiconductor within a range of 0.5° to 6° around the c-axis of the semiconductor. The plane of the Group III nitride semiconductor which is perpendicular to the second lateral vector, can be a plane rotated from the a-plane of Group III nitride semiconductor within a range of 0° to 10° around the c-axis of the semiconductor. Here, the rotational directions of m-plane and a-plane respectively include the both directions of positive and negative (a clockwise and a counterclockwise). Such a relationship between the crystal orientation of the substrate and the crystal orientation of the growing Group III nitride semiconductor is established for the hexagonal crystal substrate having a different lattice constant from that of Group III nitride semiconductor. A representative example of such hexagonal crystal substrate is a sapphire substrate. A SiC substrate and a ZnO substrate also satisfy this relationship.

A substrate in which at least a portion to be concave-convex formed of the main surface of the substrate comprises Group III nitride semiconductor or silicon carbide (SiC) may be used. That is, the case where a concave-convex structure is formed on the surface of a Group III nitride semiconductor substrate or a silicon carbide substrate or the case where a concave-convex structure is formed on the Group III nitride semiconductor layer of the template substrate is as follows. When the main surface of the substrate is a c-plane of Group III nitride semiconductor or silicon carbide (SiC), Group III nitride semiconductor is grown in the c-axis direction on the top surfaces of the posts and the bottom surfaces of the trenches. The m-plane and the a-plane of Group III nitride semiconductor or silicon carbide (SiC) of the substrate are parallel to (coincides with) the m-plane and the a-plane, respectively, of the growing Group III nitride semiconductor. Therefore, the angle between the first lateral vector of the first processed side surface and the m-axis projected vector obtained by orthogonally projecting the normal vector of the m-plane of Group III nitride semiconductor or silicon carbide of the substrate to the main surface may be from 0.5° to 6°. The angle between the second lateral vector of the second processed side surface and the a-axis projected vector obtained by orthogonally projecting the normal vector of the a-plane of Group III nitride semiconductor or silicon carbide of the substrate to the main surface may be from 0° to 10°.

When a substrate formed of hexagonal crystal Si is used, the main surface of the substrate may be a (111) plane of silicon (Si). In this case, the (111) plane of silicon (Si) is parallel to the c-plane (0001) of Group III nitride semiconductor. The first angle between the first lateral vector and the silicon (Si) [-1-12] axis projected vector obtained by orthogonally projecting the normal vector of the silicon (Si) (-1-12) plane of the substrate to the main surface may be from 0.5° to 6°. The second angle between the second lateral vector and the silicon (Si) [1-10] axis projected vector obtained by orthogonally projecting the normal vector of the silicon (Si) (1-10) plane of the substrate to the main surface may be from 0° to 10°. In this case, the (-1-12) plane of Si is parallel to the m-plane (10-10) of the growing Group III nitride semiconductor. The (1-10) plane of Si is parallel to the a-plane (11-20) of the growing Group III nitride semiconductor. Therefore, a flat crystal with a low threading dislocation density can be obtained, using the difference in crystal growth rate between in the m-axis direction and in the a-axis direction of Group III nitride semiconductor.

In the above invention, the first angle falls within a range of 1° to 5° in addition to a range of 0.5° to 6°, more preferably, a range of 1° to 2.5°. The second angle falls within a range of 0° to 10°. The second angle of 0° is most preferable because the lateral growth rate is the largest when the second angle is 0°. When the second angle θ2 is larger than 10°, that is, the direction of the second stripe structure is rotated by 10° or more from the m-axis of growing Group III nitride semiconductor, the lateral growth rate is reduced, which is not preferable. Moreover, in the above invention, preferably a buffer layer is formed on the concave-convex substrate, and thereafter, Group III nitride semiconductor is grown. The buffer layer is preferably formed by the sputtering method. The buffer layer may be formed by MBE (Molecular Beam Epitaxy) or PLD (Pulse Laser Deposition or Laser Abrasion). The Group III nitride semiconductor according to the above invention may be applied to a light-emitting device. The threading dislocations are uniformly distributed on the top surface of the grown semiconductor layer, thereby achieving uniform characteristic of the light-emitting device, and improving the yield ratio of production. As used herein, "Group III nitride semiconductor" encompasses a semiconductor represented by the formula $Al_xGa_yIn_zN$ (x+y+z=1, 0≤x, y, z≤1); such a semiconductor in which a portion of Al, Ga, or In is substituted by another Group 13 (3B) element (i.e., B or Tl), or a portion of N is substituted by another Group 15 (5B) element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

According to the first aspect, when the Group III nitride semiconductor is vertically grown in the c-axis direction on the top surfaces of the posts and the bottom surfaces of the trenches on the post-formed substrate, the normal vector of the a-plane of the growing Group III nitride semiconductor has a component perpendicular to the first processed side surface and parallel to the main surface. Since the crystal growth is faster in the a-axis direction than in the m-axis direction, the Group III nitride semiconductor is also grown in the direction parallel to the main surface of the substrate. The normal vector of the a-plane of the growing Group III nitride semiconductor has a larger component in a direction perpendicular to the second processed side surface. In the initial growth stage of Group III nitride semiconductor, the growth of triangle facets comprising the inclined m-plane is faster. Therefore, the facets of Group III nitride semiconductor in a stripe pattern parallel to the first direction of first stripe structure are formed. As a result, Group III nitride semiconductor is laterally grown as well as facet grown in the direction perpendicular to the main surface under the vertical growth conditions, thereby filling in a space among the facets. Since the second processed side surface of the second stripe structure is parallel or close to the a-plane of Group III nitride semiconductor, the growth of Group III nitride semiconductor is faster in a direction perpendicular to the second processed side surface. Thus, the threading dislocation density can be reduced on the upper surface of the grown semiconductor because threading dislocation is bent laterally through facet growth, and the differences in level caused by facet growth can be effectively filled in because the lateral growth is achieved in the a-axis direction in addition to the vertical growth. Therefore, even when a concave-convex structure having the first stripe structure and the second stripe structure which are arranged in a grid pattern as viewed from above, is formed on the substrate to improve the external quantum efficiency, threading dislocation is not distributed at a high density in the vicinity of a boundary between the posts or the trenches, particularly an intersection between the first stripe structure and the second stripe structure, thereby obtaining a flat surface of the semiconductor and an uniform threading dislocation density thereon.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 4 shows SEM images of the cross sections at an initial stage of GaN growth by the production method according to Embodiments 1 and 2;

FIG. 9B shows CL images and AFM images of the surface of GaN grown by the production method according to Embodiment 1;

DETAILED DESCRIPTION OF PREFERRED EMBODIMENTS

Specific embodiments of the present invention will next be described with reference to the drawings. However, the present invention is not limited to the embodiments.

Embodiment 1

Firstly, a relationship between the crystal orientation of the stripe structure and the crystal quality of grown GaN will be described.

Figure 1:
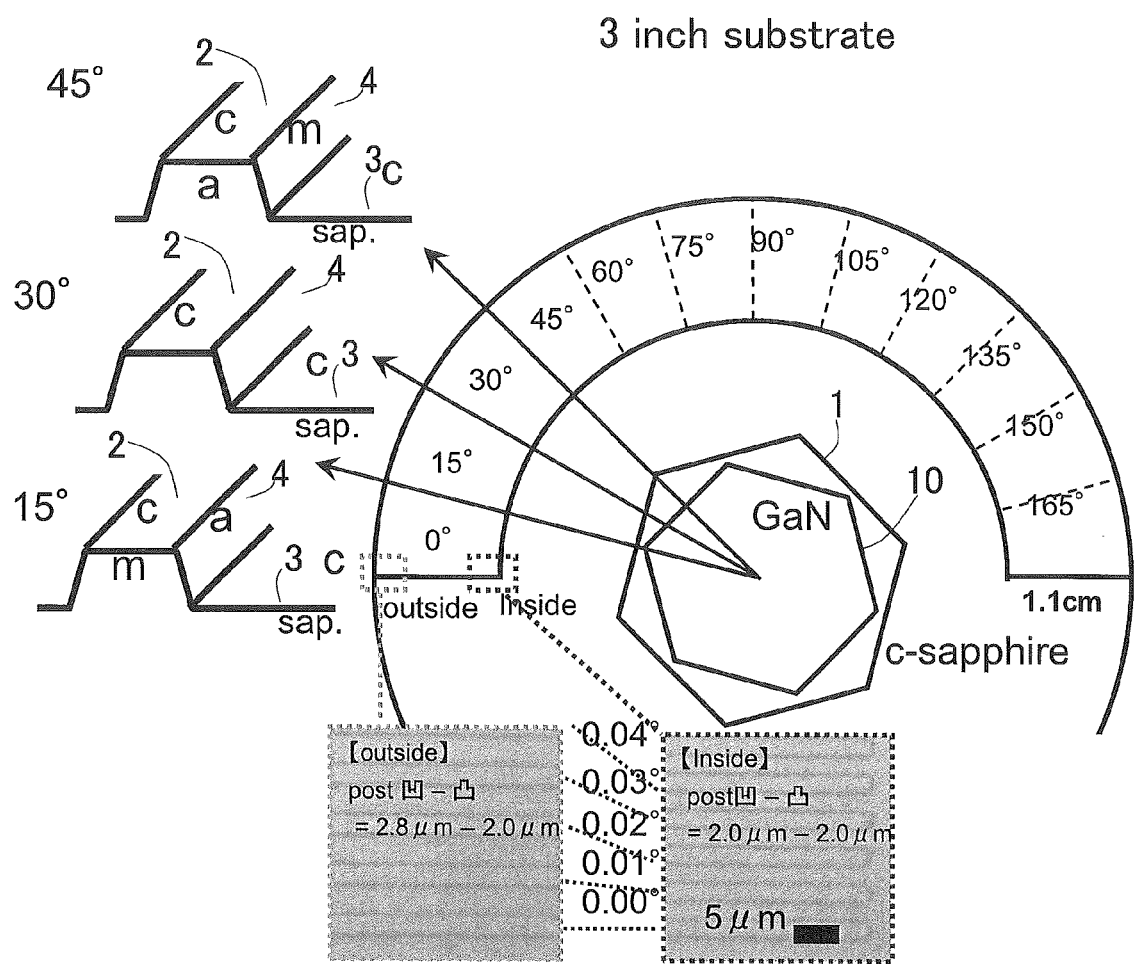
FIG. 1 is a graphical illustration showing a relationship between the processed side surface and the stripe direction in the method for growing GaN by forming posts and trenches with their stripe direction sequentially and continuously changed on a main surface of the sapphire substrate having a c-plane main surface in Embodiment 1.

GaN crystals were grown on a sapphire substrate having a thickness of 500 µm and a c-plane main surface on which processed side surfaces are formed in different crystal orientations. As shown in FIG. 1, posts 2 and trenches 3 were radially formed in a stripe pattern on the main surface of the sapphire substrate. The posts 2 and the trenches 3 were formed by forming the trenches 3 through dry etching. An interval angle of adjacent posts 2 is 0.01°. Each of the trenches 3 has a depth of 0.7 µm. Each of the trenches 3 has a width of 2.0 µm, and each of the posts 2 has a width of 2.0 µm. After the processed substrate was placed in a MOCVD growth apparatus and cleaned with a hydrogen gas, an AlN low-temperature buffer layer was formed. Thereafter, GaN was grown under the conditions for vertical growth.

In FIG. 1, when a stripe of post 2 is formed in a direction of 15° from the sapphire substrate baseline defined as 0°, the side surface 4 of the post 2 is the a-plane of sapphire, and the stripe direction is the m-axis of sapphire. The side surface 4 of the post 2 is not accurately perpendicular to the main surface of the substrate, and thus the side surface 4 is not exactly the a-plane. However, a lateral vector defined by orthogonally projecting a normal vector of the side surface 4 to the main surface of the substrate, is the normal vector of the sapphire a-plane. The characteristic of the present invention is the orientation of this lateral vector. It does not matter that the side surface 4 is inclined to the surface perpendicular to the main surface of the substrate. Therefore, hereinafter the side surface 4 is considered perpendicular to the main surface of the substrate for ease of explanation.

At this time, the side surface of the growing GaN, that is, a surface perpendicular to the lateral vector of the side surface 4 of the post 2 on the sapphire substrate is the m-plane of GaN. Moreover, when a stripe of post 2 is formed in a direction of 45°, the side surface 4 of the post 2 is the m-plane of sapphire, and the stripe direction is the a-axis of sapphire. At this time, the side surface of the growing GaN, that is, a surface perpendicular to the lateral vector of the post 2 on the sapphire substrate is the a-plane of GaN. When a stripe of post 2 is formed in a direction of 30°, the side surface 4 of the post 2 is an intermediate surface between the a-plane and the m-plane of sapphire, and the stripe direction is an intermediate direction between the m-axis and the a-axis of sapphire. A surface perpendicular to the lateral vector of the post 2 is an intermediate surface between the m-plane and the a-plane of GaN.

Figure 3A:
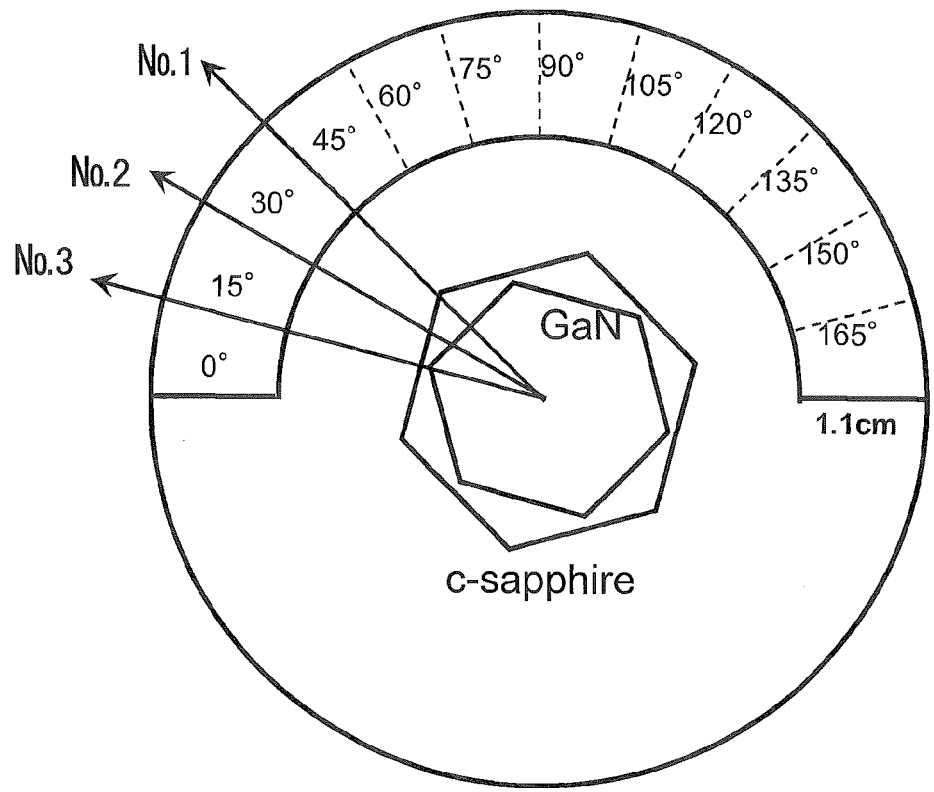
FIG. 3A is a graphical illustration showing a relationship between the stripe direction and the sample in Embodiment 1.
Figure 5:
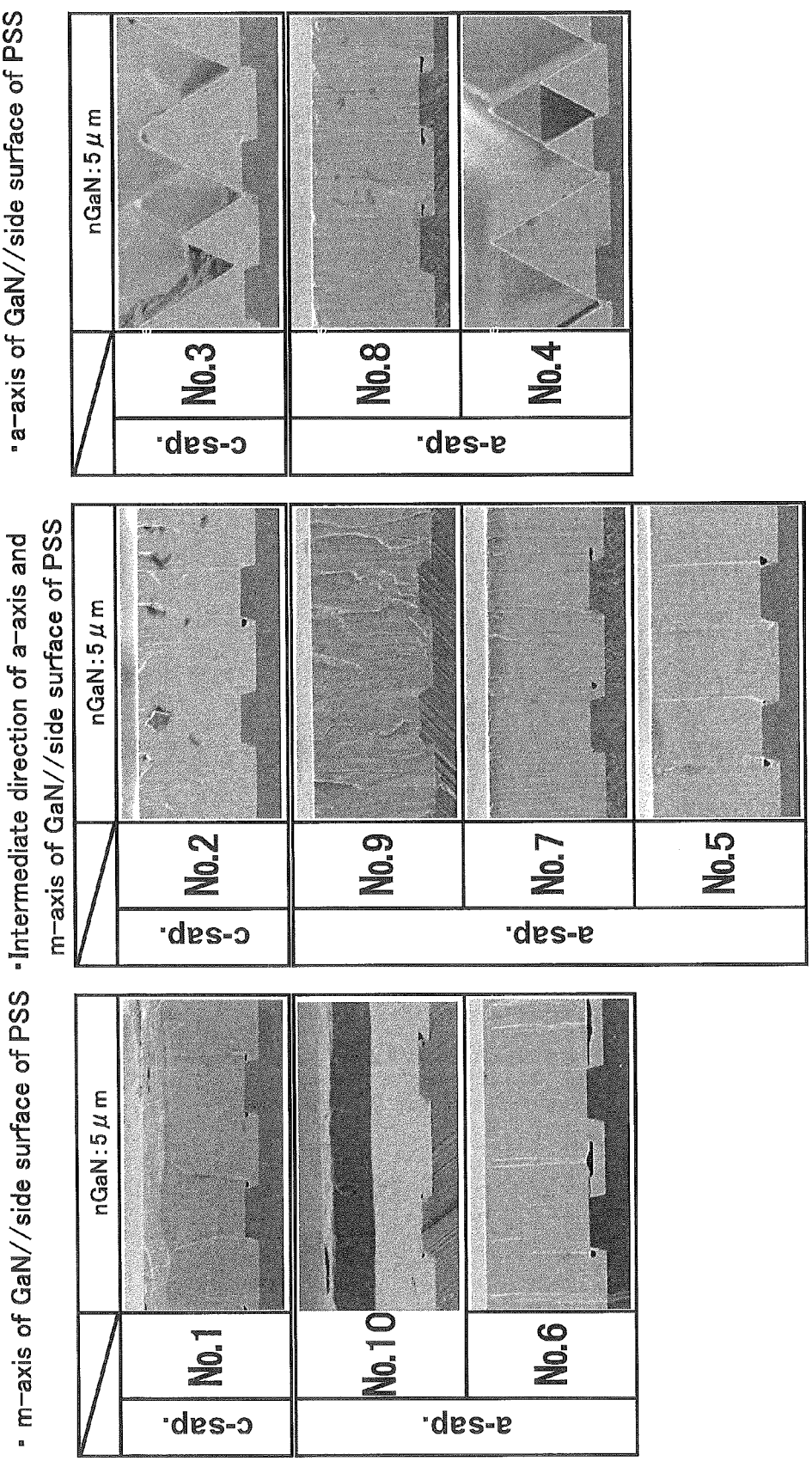
FIG. 5 shows SEM images of the cross sections when a thick film of GaN is formed by the production method according to Embodiments 1 and 2.

As shown in FIG. 3A, the post stripe direction is in a direction of 45° to the baseline of the sapphire substrate in the case of No. 1, the post stripe direction is in a direction of 30° to the baseline of the sapphire substrate in the case of No. 2, and the post stripe direction is in a direction of 15° to the baseline of the sapphire substrate in the case of No. 3. FIG. 4 shows SEM images of the cross sections perpendicular to the stripe direction when GaN was grown to a thickness of 5000 Å at an initial stage of GaN growth for the cases of No. 1, No. 2 and No. 3. Moreover, FIG. 5 shows SEM images of the cross sections perpendicular to the stripe direction when GaN was grown to a thickness of 5 μm. In the cases of No. 1 and No. 2 of FIG. 4, GaN growth is hardly observed on the side surfaces of the posts. In the case of No. 3 of FIG. 4, that is, when the stripe direction is the m-axis of sapphire, the side surface of the post is the a-plane of sapphire, and the surface perpendicular to the lateral vector is the m-plane of GaN, GaN growth is observed on the side surfaces of the posts. It is also obvious that GaN is facet grown on the top surfaces of the posts and the bottom surfaces of the trenches. As is clear from FIG. 5, in the case of No. 1, that is, when the stripe direction is the a-axis of sapphire, the side surface of the post is the m-plane of sapphire, and the surface perpendicular to the lateral vector is the a-plane of GaN, GaN is not facet grown but is vertically grown to be a uniform thickness on the main surface of the substrate. Therefore, the threading dislocation density is high in a vertical direction. On the contrary, in the case of No. 3, GaN is facet grown so that the cross section perpendicular to the stripe direction is triangle-shaped. A space among the facets is not filled with GaN. In the case of No. 2, no GaN facet growth is observed. The density of the threading dislocation extending in a vertical direction is high.

Figure 7A:
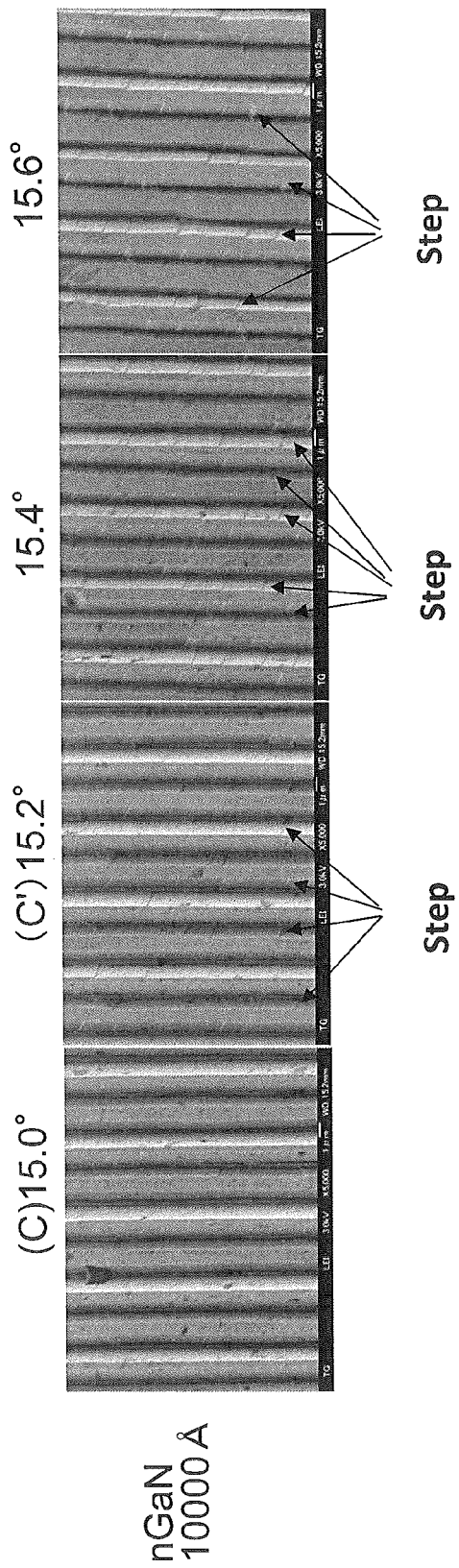
FIGS. 7A and 7B show, respectively, SEM images and a schematic illustration of the surface of GaN grown by the production method according to Embodiment 1.
Figure 7B:
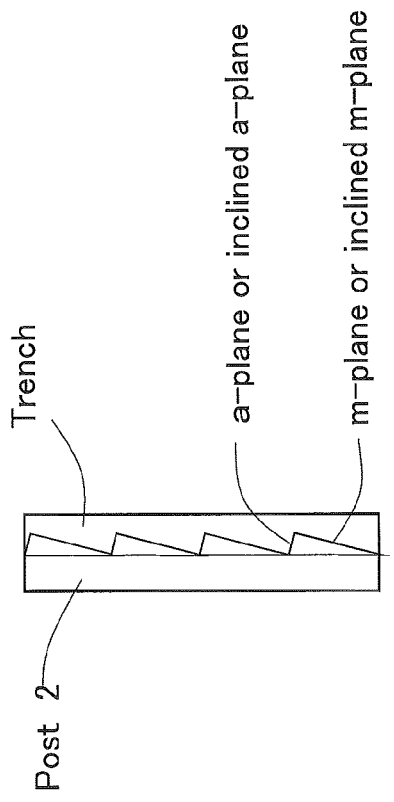
Figure 10A:
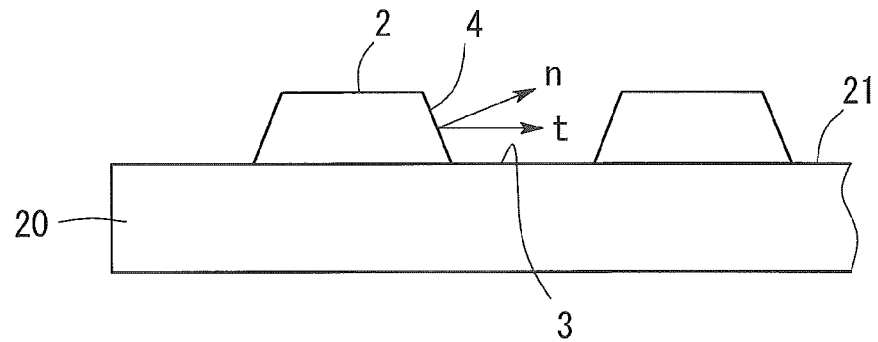
FIGS. 10A and 10B are graphical illustrations showing a relationship between a lateral vector obtained by orthogonally projecting a normal vector of the processed side surface to the main surface of the substrate and a projected vector obtained by orthogonally projecting a normal vector of sapphire a-plane to the main surface of the substrate.
Figure 10B:
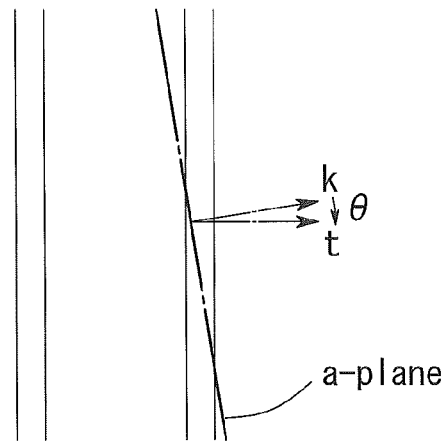

Subsequently, GaN was grown on the c-plane main surface of the sapphire substrate on which four post stripes were formed along the directions of 15.0°, 15.2°, 15.4°, 15.6° obtained by rotating the stripe direction in increments of 0.2° from the direction of 15° shown in FIG. 1. The SEM images of the surface of GaN grown to a thickness of 1 μm in these cases are shown in FIG. 7A. As shown in FIGS. 10A and 10B, an angle between the lateral vector t obtained by orthogonally projecting the normal vector n of the side surface 4 of the post 2 to the main surface 21 of the substrate 20 and the projected vector k obtained by orthogonally projecting the normal vector of the a-plane (11-20) of sapphire to the main surface 21 is defined as θ. As the direction angle θ on the main surface is rotated from the a-axis of the sapphire around the c-axis in increments of 0.2°, that is, the stripe direction of the post 2 is rotated from the m-axis of the sapphire around the c-axis in increments of 0.2°, a S plane (10-11) plane terrace and a step appear on the side surface of the growing GaN. The S plane (10-11) terrace is an inclined m-plane in the c-axis direction and the step is an inclined a-plane in the c-axis direction. Its schematic illustration is shown in FIG. 7B.

Rotating the stripe direction of the post 2 is equivalent to rotating the surface perpendicular to the lateral vector t of the post from the a-plane of sapphire around the c-axis in increments of 0.2°.

Figure 6:
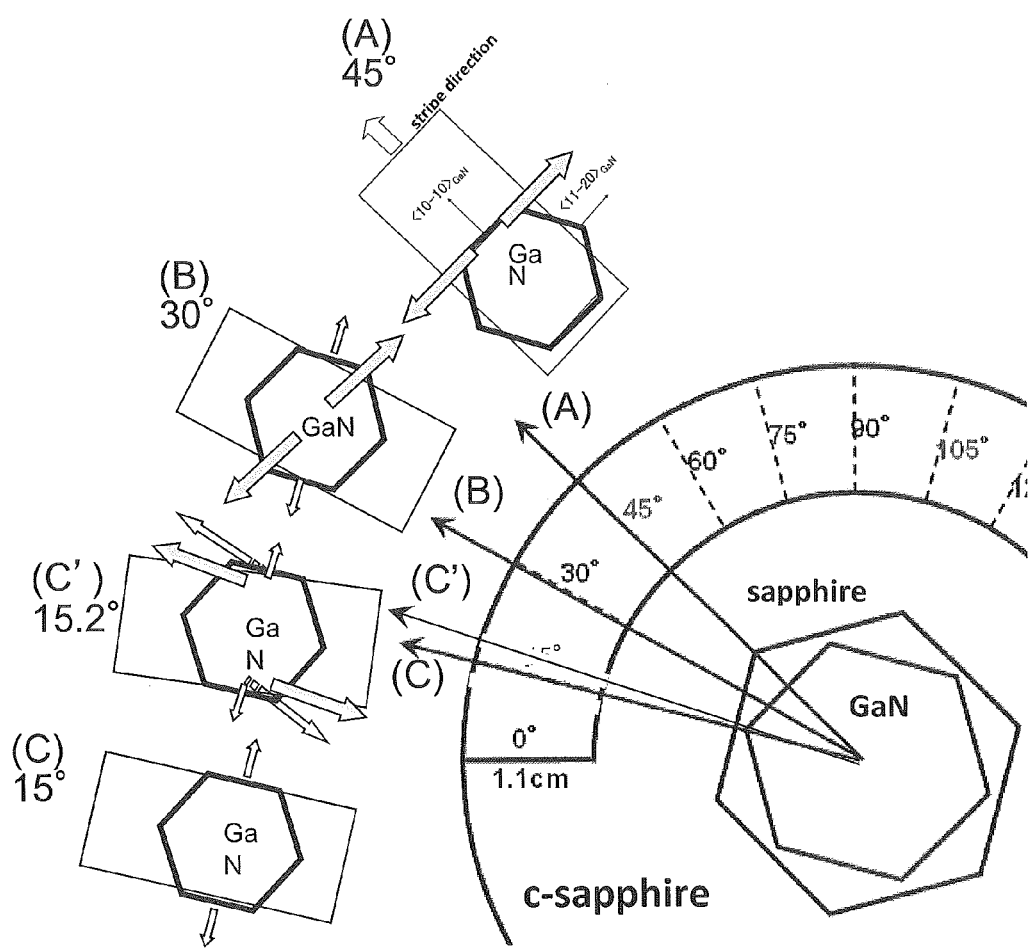
FIG. 6 is a graphical illustration showing the growth principle by the production method according to Embodiment 1.

A principle of GaN lateral growth will next be described with reference to FIG. 6. FIG. 6 shows a relationship between the post stripe direction and the crystal orientation of the growing GaN. In the direction of 15.0°, that is, when the post stripe direction is the m-axis of sapphire (the surface perpendicular to the lateral vector of the post is the a-plane of sapphire), the side surface of the post is parallel to the m-plane of GaN, and the a-axis vector of GaN does not have a component perpendicular to the side surface of the post. As the post stripe direction is rotated around the c-axis in increments of 0.2° from the direction of 15.0°, the side surface of the post becomes less parallel to the m-plane of GaN. Thus, the a-axis vector of GaN has a component perpendicular to the side surface of the post, and the component of the a-axis vector of GaN gradually increases. GaN growth is faster in the a-axis direction than in the m-axis direction. Therefore, as the above angle θ is increased, lateral growth is faster in a direction of the lateral vector. However, when the angle θ is excessively increased, GaN is not facet grown.

Figure 8:
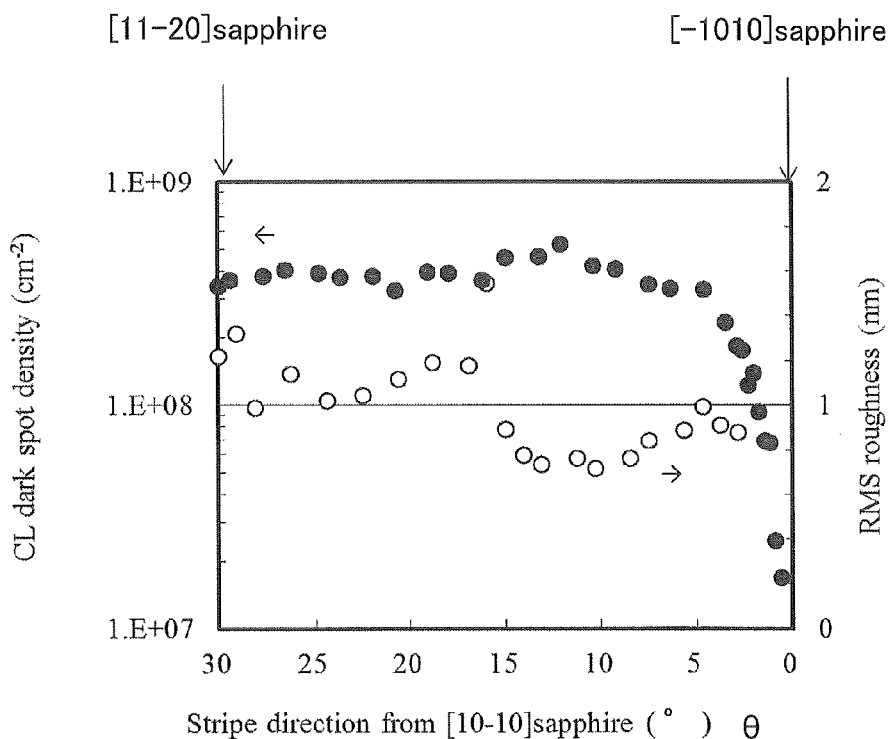
FIG. 8 is a graph showing a relationship between the dark spot density of GaN grown by the production method according to Embodiment 1 and the stripe direction of post.
Figure 9A:
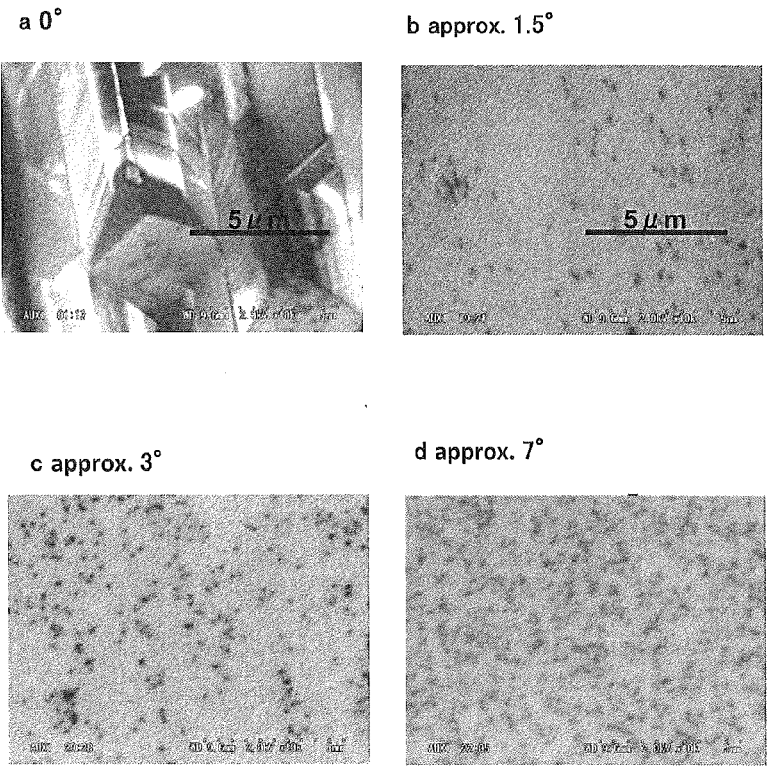
FIG. 9A shows CL images of the surface of GaN grown by the production method according to Embodiment 1.
Figure 9B:
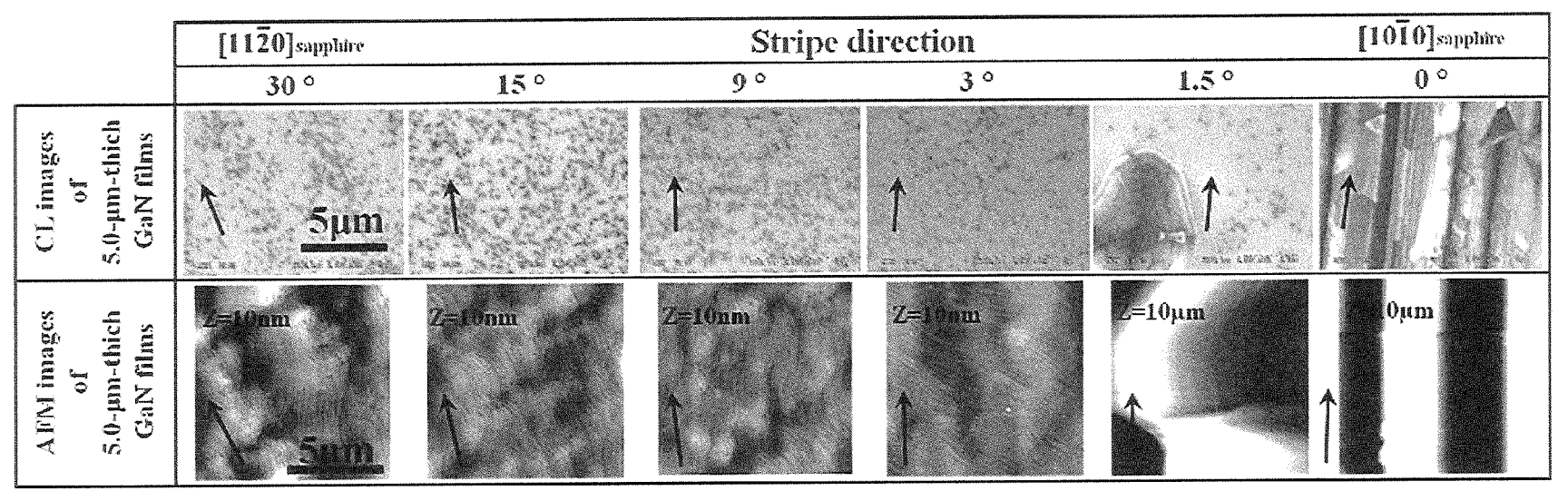
Figure 9C:
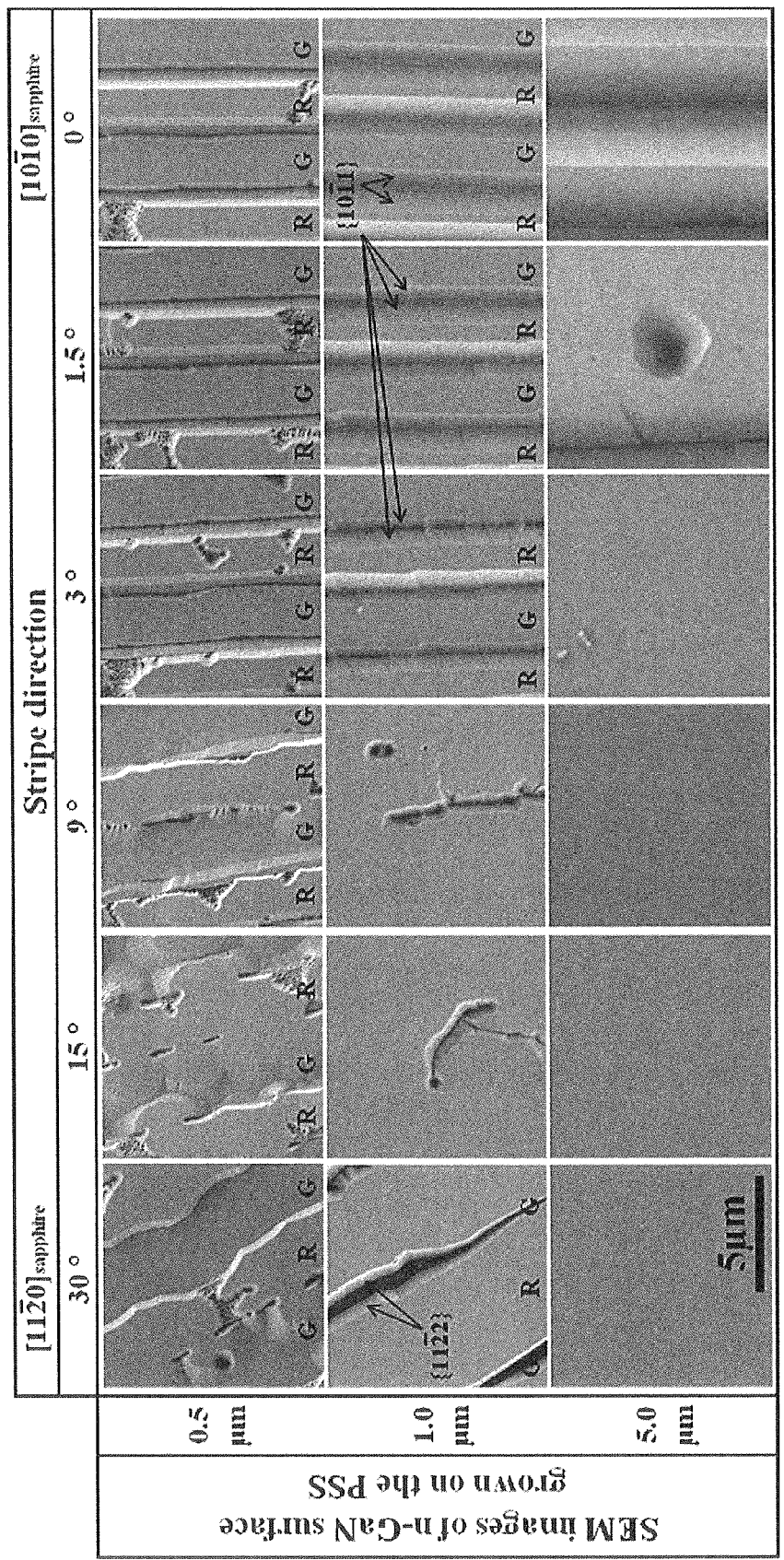
FIG. 9C shows SEM images of the surface of GaN grown by the production method according to Embodiment 1.

FIG. 8 shows a relationship between the angle θ and the dark spot density of CL images of GaN grown to a thickness of 5 μm when the angle between the lateral vector t obtained by orthogonally projecting the normal vector n of the side surface 4 of the post 2 to the main surface 21 of the substrate 20 and the projected vector k obtained by orthogonally projecting the normal vector of the a-plane (11-20) of sapphire to the main surface 21 shown in FIGS. 10A and 10B was varied. When the a-plane of sapphire is accurately perpendicular to the main surface 21, the normal vector of the a-plane completely coincides with the projected vector k of the normal vector on the main surface. Moreover, when the post stripe direction is in a direction of 15° to the baseline of the sapphire substrate as shown in FIG. 1, the angle θ is 0. When the angle θ is 0, the stripe direction is the m-axis of sapphire, and the angle θ is also an angle between the stripe direction of the post 2 and the m-axis. FIGS. 9A and 9B show CL images. High dark spot density means that the threading dislocation density is high. FIG. 9B shows AFM images of the grown GaN surface. When the angle θ was 0° and 1.5°, pits were observed. When the angle θ was 3°, no pits were observed, indicating that the threading dislocation density is low. Therefore, most preferably, the angle θ is 3°. FIG. 9C shows SEM images of the surfaces of the GaN grown up to a thickness of 0.5 μm, 1.0 μm, and 5.0 μm when the angle θ is 0°, 1.5°, 3°, 9°, 15°, and 30°. When the angle θ was 1.5° and 3°, GaN growth in the a-axis direction was observed, indicating that the trenches are filled well.

As shown in FIG. 8, when the angle θ is 0°, that is, the side surface 4 of the post 2 is the a-plane of sapphire (the lateral vector is the a-axis and the stripe direction is the m-axis), GaN is facet grown, resulting in an extremely rough surface. When the angle θ falls within a range of 6° to 15°, the GaN surface is smooth, but the threading dislocation density is high. When the angle θ is 15°, the side surface of the post is an intermediate surface between the m-plane and the a-plane of sapphire (the lateral vector is in an intermediate direction between the m-axis and the a-axis). When the angle θ is 6°, the threading dislocation density is $3.3 \times 10^8 / \text{cm}^2$. When the angle θ is reduced to 6° or less, the threading dislocation density is $3.3 \times 10^8 / \text{cm}^2$ or less. When the angle θ is 0.5°, the threading dislocation density is reduced to $1.7 \times 10^7 / \text{cm}^2$. Therefore, the angle θ is preferably 0.5° to 6° to grow GaN so as to fill in a space among the facets and have a low threading dislocation density. When the angle θ exceeds 6°, GaN facet growth is difficult.

Moreover, the threading dislocation density is $3.3 \times 10^8 / \text{cm}^2$ when the angle θ is 5°, $1.8 \times 10^8 / \text{cm}^2$ when the angle θ is 3°, $1.7 \times 10^8 / \text{cm}^2$ when the angle θ is 2.5°, $6.9 \times 10^7 / \text{cm}^2$ when the angle θ is 1.5°, and $2.5 \times 10^7 / \text{cm}^2$ when the angle θ is 1°. As is clear from FIG. 9A, when the angle θ is 1.5°, 3°, and 7°, the surface is smooth. However, as the angle θ is increased, the threading dislocation density is increased. Therefore, to obtain GaN with a smooth surface and a low threading dislocation density, the angle θ is preferably 0.5° to 6°. More preferably, the angle θ is 0.5° to 5° or 1° to 5°. Further preferably, the angle θ is 1° to 2.5°.

The present invention has been accomplished based on the relationship between the crystal orientation of the stripe structure and the crystallinity of the grown GaN, which is characterized in that a concave-convex structure having a first stripe structure and a second stripe structure is formed on the surface of the substrate.

Figure 11:
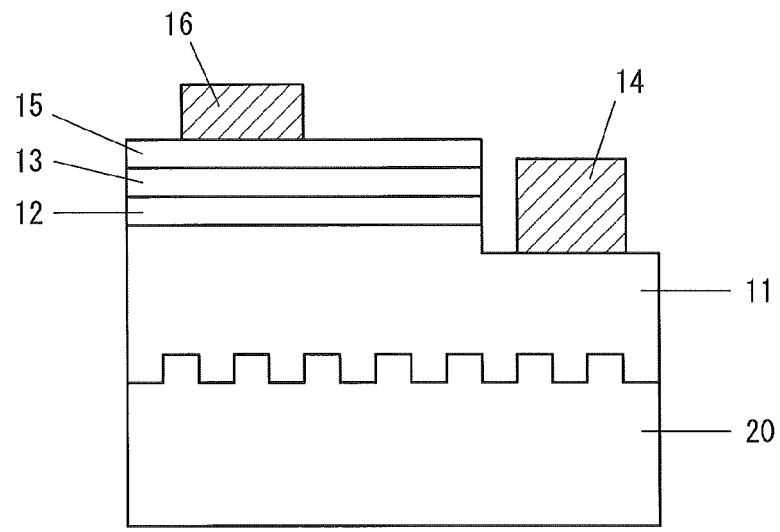
FIG. 11 is a cross-sectional view showing the structure of a light-emitting device according to Embodiment 1.

A light-emitting device according to Embodiment 1 will be described. FIG. 11 shows the structure of a Group III nitride semiconductor light-emitting device according to Embodiment 1. The Group III nitride semiconductor light-emitting device according to Embodiment 1 includes a sapphire substrate 20 having a concave-convex structure on a surface thereof; and an n-type layer 11, a light-emitting layer 12, and a p-type layer 13, which are sequentially deposited on the concave-convex structure of the sapphire substrate 20 via a buffer layer (not illustrated), and each of which is formed of a Group III nitride semiconductor. The n-type layer 11, the light-emitting layer 12, and the p-type layer 13 constitutes a device layer (layered structure). A portion of the light-emitting layer 12 and a portion of the p-type layer 13 are removed by etching, and the corresponding portion of the surface of the n-type layer 11 is exposed. An n-electrode 14 is formed on the exposed portion of the surface of the n-type layer 11. An ITO transparent electrode 15 is formed on almost the entire top surface of the p-type layer 13, and a p-electrode 16 is formed on the transparent electrode 15. The Group III nitride semiconductor light-emitting device according to Embodiment 1 is of a face-up type.

Each of the n-type layer 11, the light-emitting layer 12, and the p-type layer 13 may have any of conventionally known structures. For example, the n-type layer 11 has a structure in which a GaN n-type contact layer doped with Si at high concentration and a GaN n-cladding layer are sequentially deposited on the sapphire substrate 20. The light-emitting layer 12 has an MQW structure in which GaN barrier layers and InGaN well layers are alternately deposited. The p-type layer 13 has a structure in which an AlGaN p-cladding layer doped with Mg and a GaN p-contact layer doped with Mg are sequentially deposited on the light-emitting layer 12.

Figure 12A:
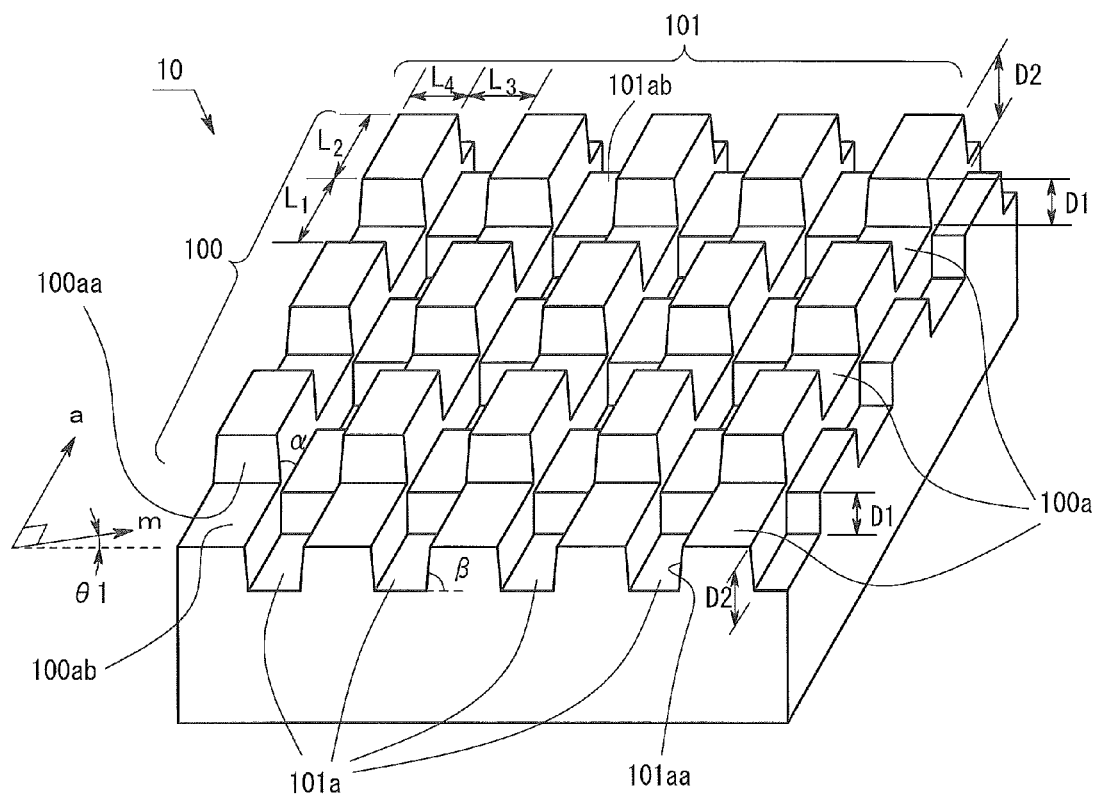
FIG. 12A is a perspective view showing the concave-convex structure on the sapphire substrate of the Group III nitride semiconductor light-emitting device according to Embodiment 1.
Figure 12B:
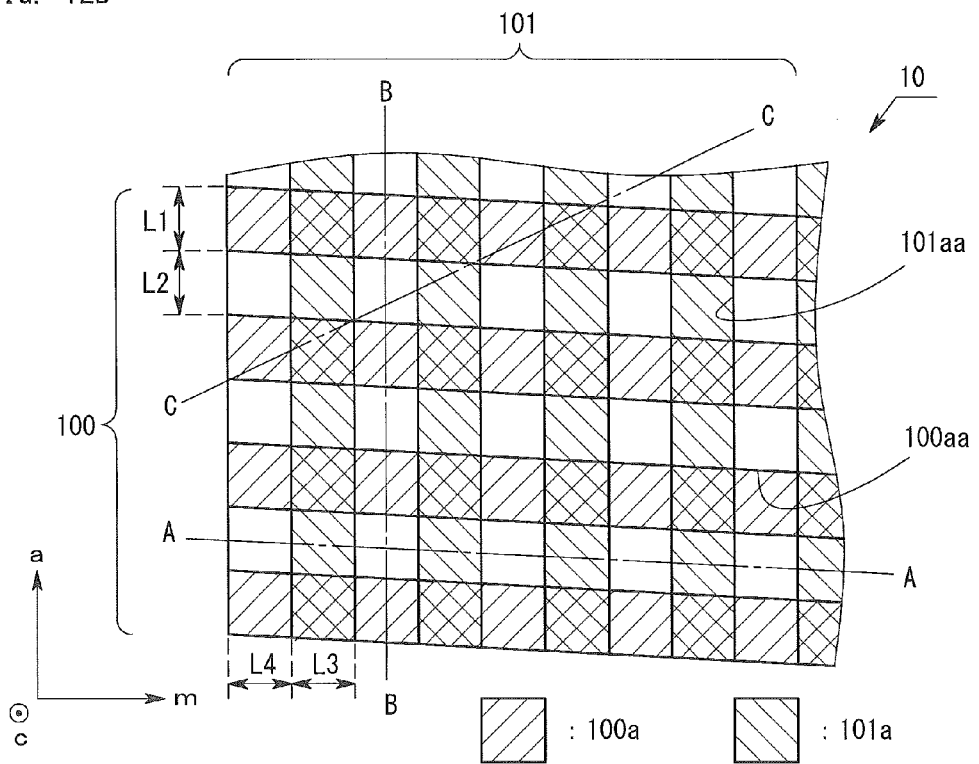
FIG. 12B is a plan view showing the concave-convex structure on the sapphire substrate of the Group III nitride semiconductor light-emitting device according to Embodiment 1.

FIG. 12A is a perspective view of a concave-convex structure formed on the top surface of the sapphire substrate 20, and FIG. 12B is a top view of the sapphire substrate 20. As shown in FIGS. 12A and 12B, a second stripe structure 101 is formed on the top surface of the sapphire substrate 20, and a first stripe structure 100 is overlapped on the second stripe structure 101.

The second stripe structure 101 includes a plurality of second grooves 101*a* which are arranged at regular intervals in parallel to the second direction corresponding to the a-axis direction of sapphire. Preferably, the width L3 of each second groove 101*a* is 0.1 μm to 20 μm, and the distance L4 between adjacent second grooves 101*a* is 0.1 μm to 20 μm. This is because, when the width L3 and the distance L4 fall within the above ranges, light extraction performance can be further improved. More preferably, the width L3 is 0.1 μm to 5 μm, and the distance L4 is 0.1 μm to 5 μm. The angle β between each of side surfaces 101*aa* of the second groove 101*a* (the second processed side surfaces) and the main surface of the sapphire substrate 20 is preferably 40° to 80°. This is because, when the angle β falls within the above range, light extraction performance can be further improved. More preferably, the angle β is 50° to 70°. The depth D2 of each second groove 101*a* is preferably 0.1 μm to 3 μm. This is because, when the depth D2 falls within the above range, light extraction performance can be further improved. More preferably, the depth D2 is 0.5 μm to 2 μm.

The first stripe structure 100 includes a plurality of first grooves 100*a* which are arranged at regular intervals in parallel to the first direction corresponding to a direction inclined at an off-angle of 3° around the c-axis from the m-axis of sapphire. Thus, an angle between the first direction and the second direction and an angle between the first lateral vector and the second lateral vector are 87°. The width L1 of each first groove 100*a* is preferably 0.1 μm to 20 μm, and the distance L2 between adjacent first grooves 100*a* is 0.1 μm to 20 μm. This is because, when the width L1 and the distance L2 fall within the above ranges, light extraction performance can be further improved. More preferably, the width L1 is 0.1 μm to 5 μm, and the distance L2 is 0.1 μm to 5 μm. The angle α between each of side surfaces 100*aa* of the first grooves 100*a* and the main surface of the sapphire substrate 20 is preferably 40° to 80°. This is because, when the angle α falls within the above range, light extraction performance can be further improved. More preferably, the angle α is 50° to 70°. The depth D1 of each first groove 100*a* is preferably 0.1 μm to 3 μm. This is because, when the depth D1 falls within the above range, light extraction performance can be further improved. More preferably, the depth D1 is 0.5 μm to 2 μm. Difference in level D2 produced by the depth D2 of each second groove 101*a* is provided in each first groove 100*a*. Difference in level D1 produced by the depth D1 of each first groove 100*a* is provided in each second groove 101*a*.

The depth D1 of the first groove 100*a* may be different from the depth D2 of the second groove 101*a*. Also, the depth D1 of the first groove 100*a* may be equal to the depth D2 of the second groove 101*a*. When the depth D1 is equal to the depth D2, the top surface of the first groove 100*a* and the top surface of the second groove 101*a* are equal in depth. Needless to say, the bottom surface of the first groove 100*a* and the bottom surface of the second groove 101*a* are on the same surface. Therefore, in this case, there are three different surface levels including the uppermost surface. When the depth D2 of each second groove 101*a* is larger than the depth D1 of each first groove 100*a*, the top surface of each first groove 100*a* is positioned above the top surface of each second groove 101*a*, and a difference in level is produced therebetween. In this case, there are four surface levels: the uppermost surface (the unetched surface of the sapphire substrate 20), the top surface of each first groove 100*a*, the top surface of each second groove 101*a*, the bottom surfaces of each first groove 100*a* and each second groove 101*a*. On the contrary, when the depth D1 of each first groove 100*a* is large than the depth D2 of each second groove 101*a*, the top surface of each first groove 100*a* is positioned below the top surface of each second groove 101*a*, and a difference in level is produced therebetween. In this case, there are four surface levels: the uppermost surface (the unetched surface of the sapphire substrate 20), the top surface of each second groove 101*a*, the top surface of each first groove 100*a*, and the bottom surfaces of each first groove 100*a* and each second groove 101*a* are deepened in this order.

The width L1 of each first groove 100*a* may be equal to or different from the width L3 of each second groove 101*a*, the distance L2 between adjacent first grooves 100*a* may be equal to or different from the distance L4 between adjacent second grooves 101*a*. Also, the angle α may be equal to or different from the angle β.

In the concave-convex structure, one or more differences in level are provided in any cross section perpendicular to the main surface of the sapphire substrate 20, and two or more differences in level are provided in a specific cross section perpendicular to the main surface of the sapphire substrate 20. For example, in a cross section as taken along line A-A parallel to the first direction, no difference in level is provided by the first stripe structure 100, but one difference in level is provided by the second stripe structure 101. In a cross section as taken along line B-B parallel to the second direction, no difference in level is provided by the second stripe structure 101, but one difference in level is provided by the first stripe structure 100. Meanwhile, in a cross section as taken along line C-C shown in FIG. 12B, four differences in level including the uppermost surface are provided by the first stripe structure 100 and the second stripe structure 101 because the depths D1 and D2 are different.

When the concave-convex structure is formed as described above, light propagated in the device in a direction parallel to the main surface of the sapphire substrate 20 can be irregularly reflected in any direction by means of a difference in level provided by the first stripe structure 100 or the second stripe structure 101, and the thus-reflected light can be extracted on the light extraction side (i.e., on the n-electrode 14 side or the p-electrode 16 side). Therefore, the Group III nitride semiconductor light-emitting device according to Embodiment 1 exhibits improved light extraction performance, as compared with a conventional Group III nitride semiconductor light-emitting device.

Next will be described processes for producing the Group III nitride semiconductor light-emitting device according to Embodiment 1 with reference to FIGS. 13A, 13B, 14A, and 14B.

Figure 13A:
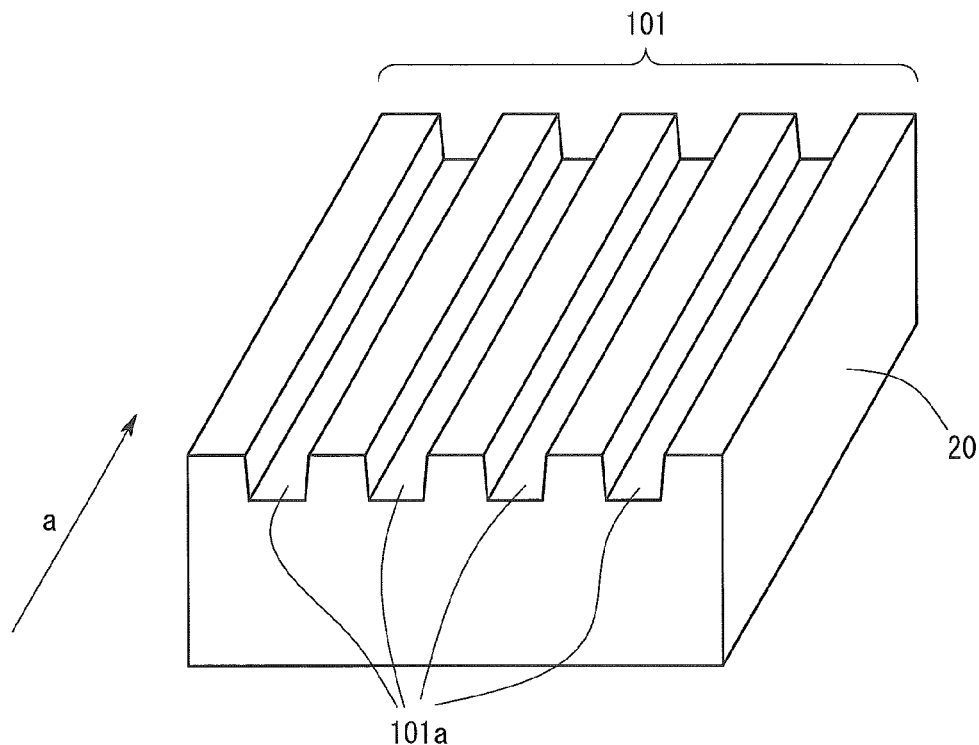
FIGS. 13A and 13B are sketches showing processes forming the concave-convex structure on the sapphire substrate.

Now will be described formation of a concave-convex structure on a sapphire substrate 20. Firstly, as shown in FIG. 13A, a second stripe structure 101 is formed on the top surface of the sapphire substrate 20 through photolithography and dry etching, so that second grooves 101a are periodically arranged at specific intervals in parallel to the second direction corresponding to the a-axis direction of sapphire.

Figure 13B:
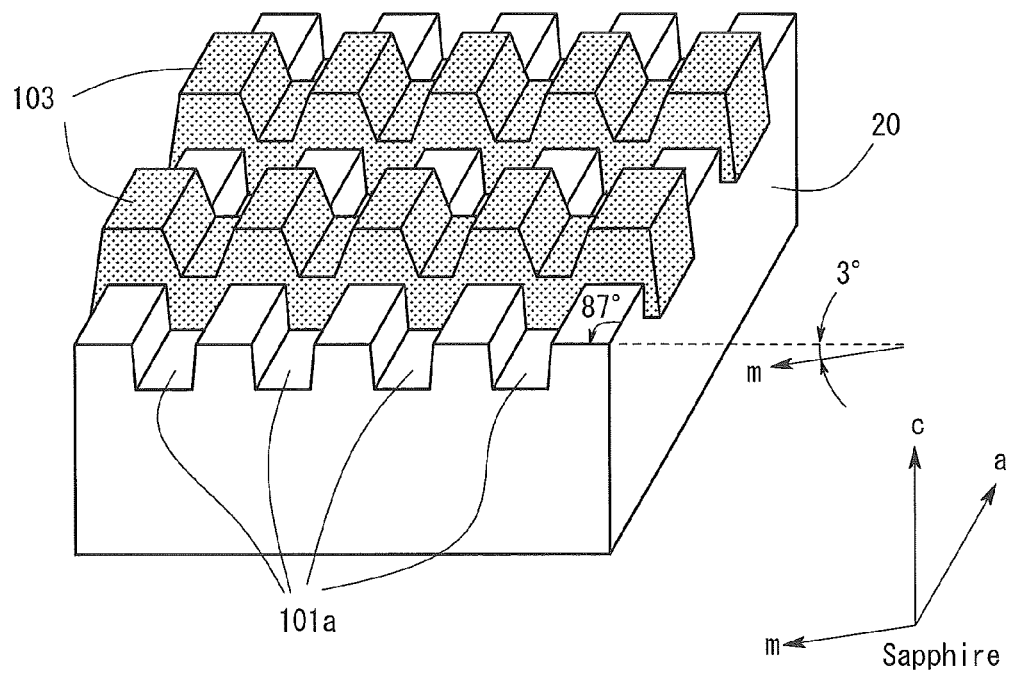

Subsequently, as shown in FIG. 13B, a stripe-shaped photomask 103 is formed through photolithography on the second stripe structure 101 provided on the top surface of the sapphire substrate 20, so that openings of the photomask are periodically arranged at specific intervals in parallel to the first direction corresponding to a direction inclined at an off-angle of 3° around the c-axis from the m-axis of sapphire. Thereafter, a portion of the top surface of the sapphire substrate 20 which is not covered with the photomask 103 is subjected to dry etching, and then the photomask 103 is removed, to thereby form a concave-convex structure shown in FIG. 12A on the top surface of the sapphire substrate 20.

When the top surface of the sapphire substrate 20 is subjected to dry etching through different two processes as described above, edges of the thus-formed posts can be prevented from becoming round, and the concave-convex structure can be formed with high precision.

Subsequently, thermal cleaning is carried out for recovery from damage to the sapphire substrate 20 due to formation of the aforementioned concave-convex structure, or removing impurities from the surface of the sapphire substrate 20. Thermal cleaning is realized by, for example, thermal treatment in a hydrogen atmosphere at 1,000° C. to 1,200° C.

Figure 14A:
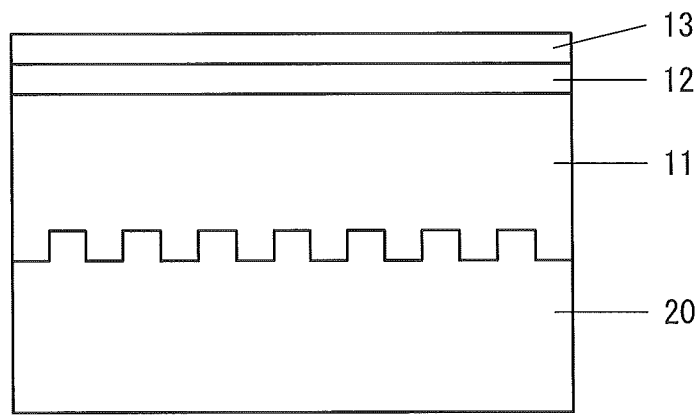
FIGS. 14A and 14B are sketches showing processes for producing the Group III nitride semiconductor light-emitting device according to Embodiment 1.

Next, on the sapphire substrate 20 on which the concave-convex structure has been formed as described above, an AlN buffer layer (not illustrated) is formed so as to have a thickness of 10 Å to 1000 Å by MOCVD at a temperature range of 300° C. to 500° C. An n-type layer 11, a light-emitting layer 12, and a p-type layer 13 are sequentially deposited on the buffer layer (FIG. 14A). The n-type layer 11 is initially formed on the concave-convex structure at a temperature of 1,000° C. to 1,100° C. to promote facet grown. Thereafter, the temperature is increased to 1,100° C. or higher to promote lateral growth, to thereby properly fill in a space among facets. The n-type layer 11 may be formed at a constant temperature within a range of 1,000° C. to 1,200° C. Even in this case, the n-type layer 11 with a flat uppermost surface and a low threading dislocation density, i.e., uniformly distributed threading dislocations, was obtained. The raw material gases, etc. employed for MOCVD are as follows: ammonia ($NH_3$) as a nitrogen source, trimethylgallium ($Ga(CH_3)_3$) as a Ga source, trimethylindium ($In(CH_3)_3$) as an In source, trimethylaluminum ($Al(CH_3)_3$) as an Al source, silane ($SiH_4$) as an n-type doping gas, cyclopentadienylmagnesium ($Mg(C_5H_5)_2$) as a p-type doping gas, and $H_2$ or $N_2$ as a carrier gas.

Figure 14B:
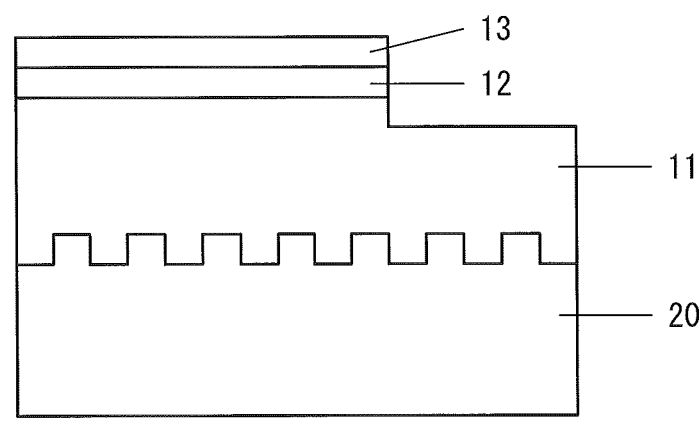

Thereafter, a portion of the p-type layer 13 and a portion of the light-emitting layer 12 are removed through dry etching, to thereby expose the corresponding portion of the surface of the n-type layer 11 (FIG. 14B). Then, a transparent electrode 15 is formed on almost the entire top surface of the p-type layer 13; an n-electrode 14 is formed on the thus-exposed portion of the surface of the n-type layer 11; and a p-electrode 16 is formed on the transparent electrode 15. Thus, the Group III nitride semiconductor light-emitting device according to Embodiment 1 is produced.

Figure 15:
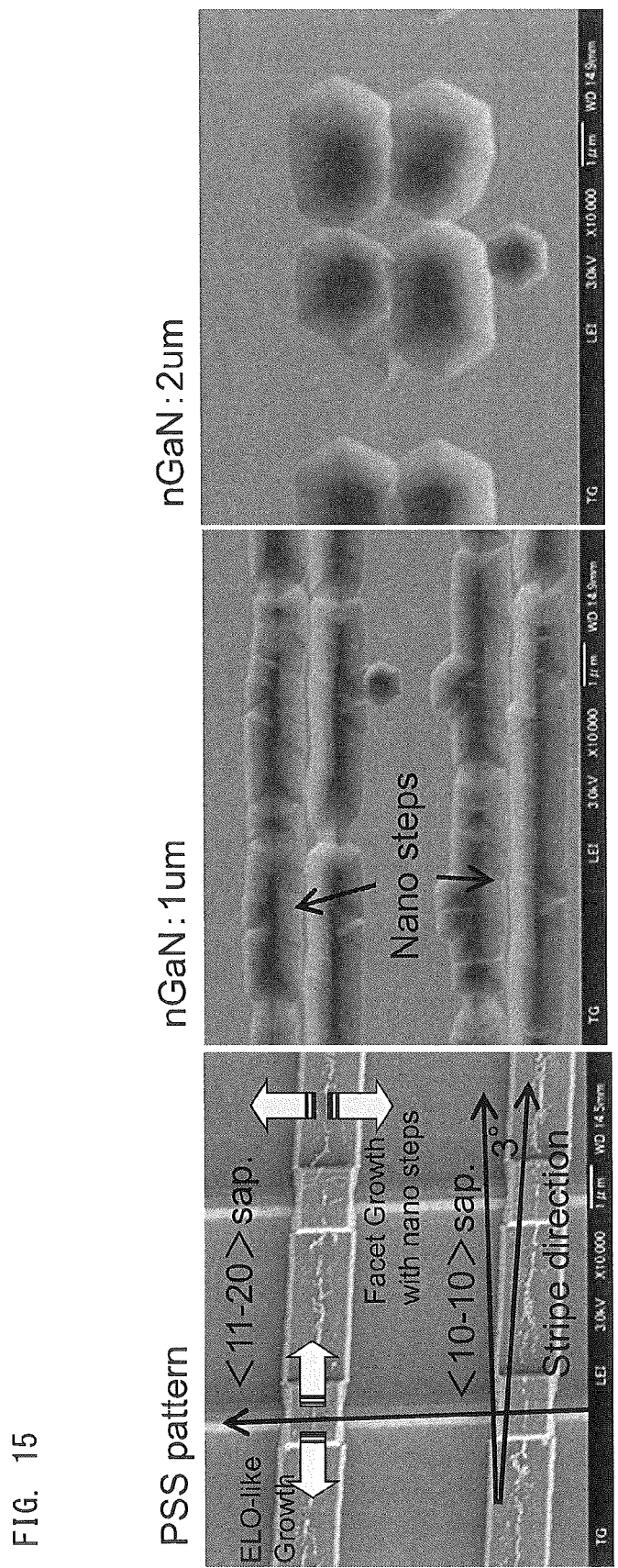
FIG. 15 shows SEM images of the surface of GaN grown by the production method according to Embodiment 1.
Figure 17:
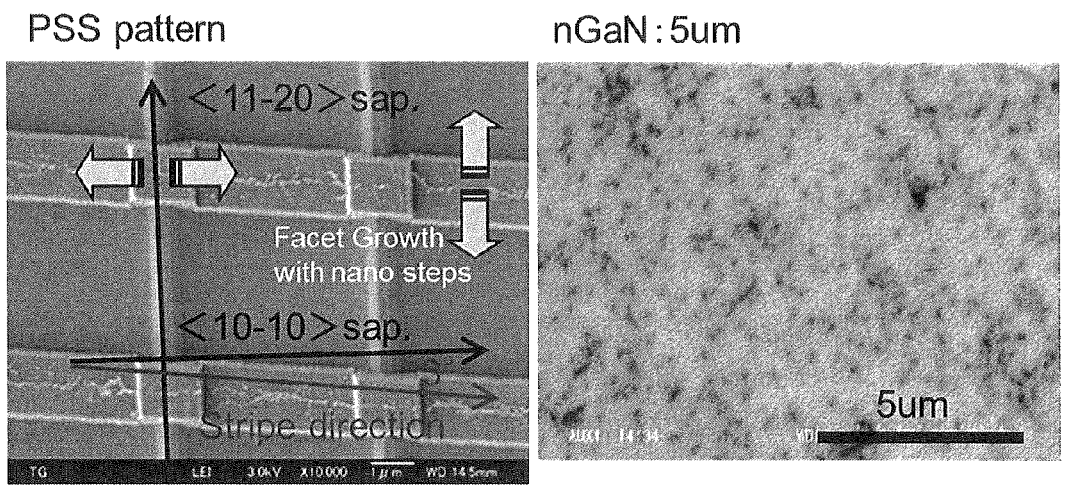
FIG. 17 shows CL images of the surface of GaN grown by the production method according to Embodiment 1.

The following experiment was performed to measure a relationship between the crystal orientations of the first stripe structure and the second stripe structure and the crystallinity of the grown GaN. A buffer layer was formed on the sapphire substrate 20 after the formation of the first stripe structure 100 and the second stripe structure 101. GaN was grown to a thickness of 1 μm and 2 μm. FIG. 15 shows SEM images of the grown GaN surface. When the thickness is 2 μm, differences in level are properly filled in. FIG. 17 shows CL images of the GaN surface. The threading dislocations are uniformly distributed on the surface. The threading dislocation density was $3.6 \times 10^8/cm^2$ at 5 μm thickness of GaN.

Figure 16:
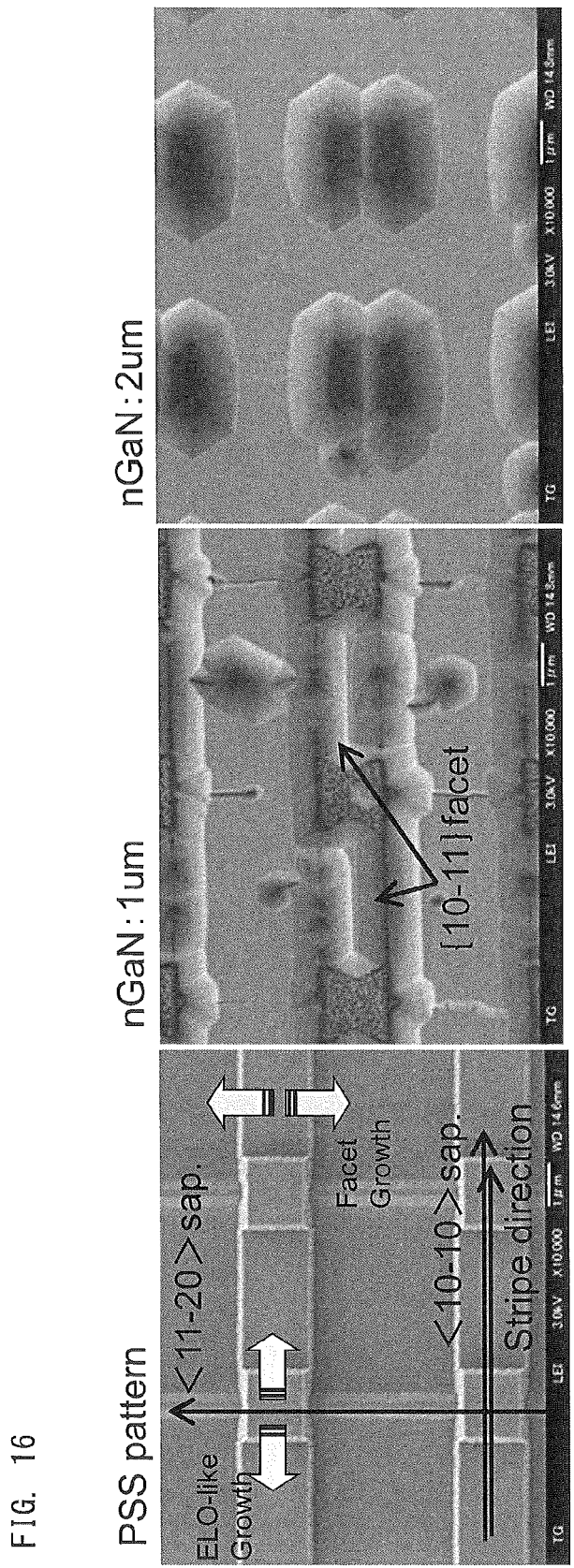
FIG. 16 shows SEM images of the surface of GaN grown by the production method according to Comparative Example.
Figure 18:
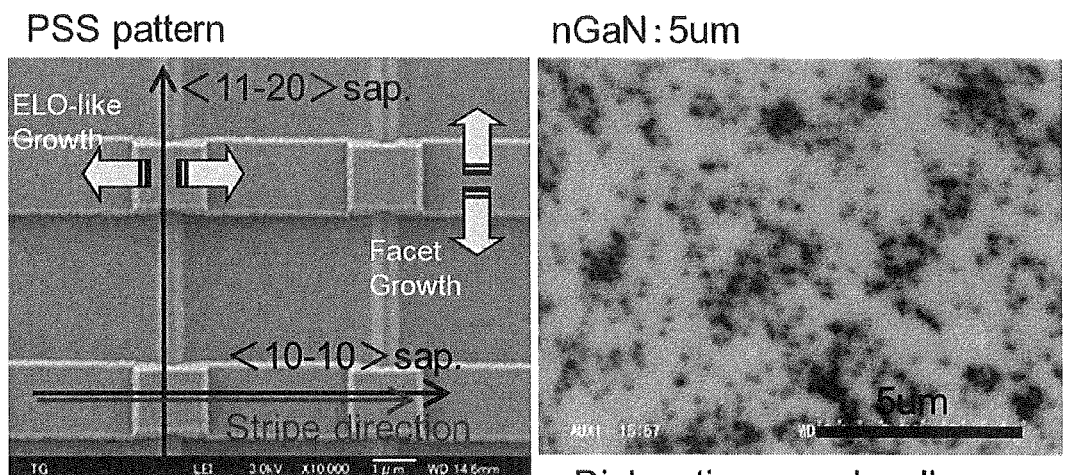
FIG. 18 shows CL images of the surface of GaN grown by the production method according to Comparative Example.

For comparison, the following concave-convex structure was prepared. The first direction in which the first stripe structure extends is the m-axis of sapphire, and thus the first lateral vector which is a projected vector obtained by orthogonally projecting the normal vector of the first processed side surface to the main surface is the a-axis of sapphire. The second direction in which the second stripe structure extends is the a-axis of sapphire, and thus the second lateral vector which is a projected vector obtained by orthogonally projecting the normal vector of the second processed side surface to the main surface is the m-axis of sapphire. That is, the first direction is crossing the second direction, and the first lateral vector is crossing the second lateral vector. FIG. 16 shows SEM images of the GaN grown on the sapphire substrate. The m-plane facets of GaN are clearly observed, and a space among adjacent facets is not completely filled in. FIG. 18 shows CL images of the GaN surface. The threading dislocations are locally distributed on the surface, and high threading dislocation density portions are observed everywhere. The threading dislocation density was $4.2 \times 10^8/cm^2$ at 5 μm thickness of GaN.

The first direction in which the first stripe structure 100 extends may be the crystal orientation rotated from the m-axis of sapphire within a range of 0.5° to 6° around the c-axis of sapphire. In this case, as described in the characteristic of FIG. 8, GaN is facet grown with the inclined m-plane as a facet plane, and the threading dislocation density is low.

Therefore, even if the second direction in which the second stripe structure 101 extends is fixed to the a-axis of sapphire, and the first direction is the crystal orientation rotated from the m-axis of sapphire within a range of 0.5° to 6° around the c-axis of sapphire, that is, an angle between the first lateral vector and a projected vector of the a-axis of sapphire falls within a range of 0.5° to 6°, the similar result is obtained. This is because three-dimensional facet growth is promoted at the initial stage of GaN crystal growth, thereby achieving a growth regulated in the first stripe structure 100. When the second direction in which the second stripe structure 101 extends is the a-axis of sapphire (the second lateral vector is the m-axis of sapphire), the side surface of GaN parallel to the second direction (the side surface perpendicular to the m-axis of sapphire) is the a-plane of GaN. Therefore, GaN easily grows in a direction perpendicular to the second direction on the main surface, i.e., a lateral direction, and thereby achieving a flat surface of GaN by filling in a space among the facets.

Figure 19:
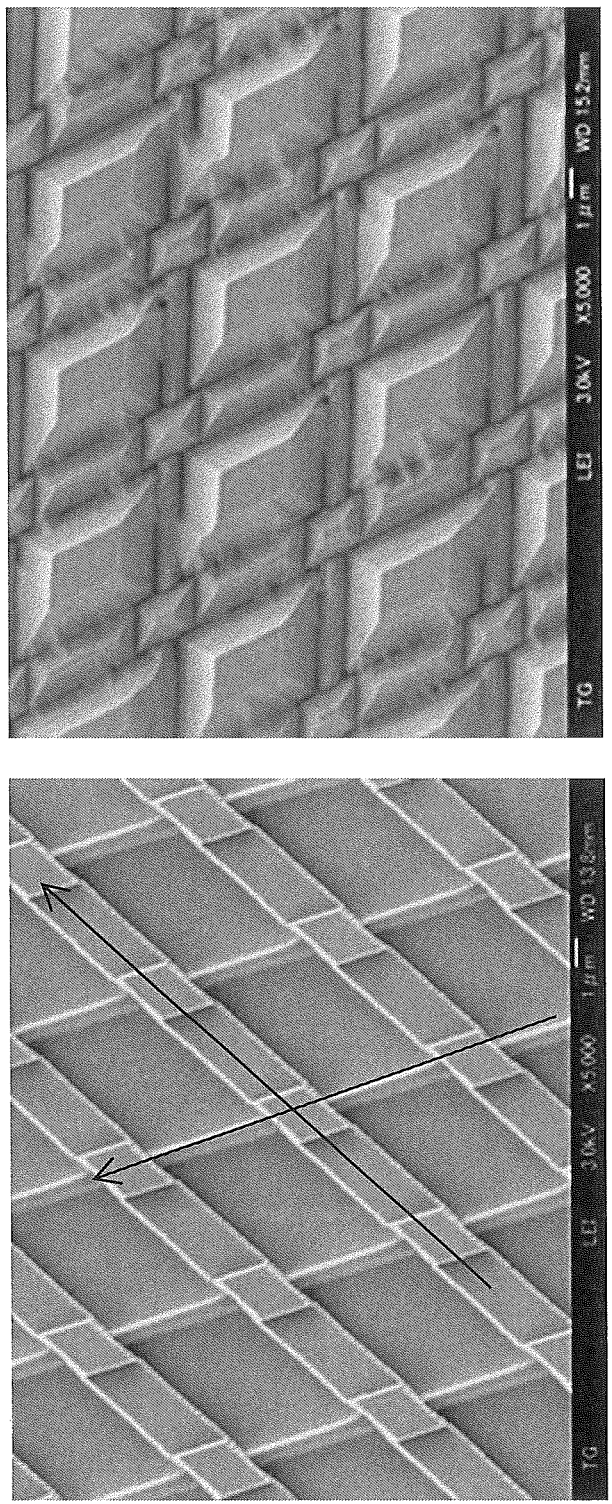
FIG. 19 shows SEM images of the surface of GaN grown by the production method according to Comparative Example.

For comparison, GaN was grown when the first direction in which the first stripe structure 100 extends is a direction rotated from the m-axis of sapphire by 3° around the c-axis of sapphire, and the second direction in which the second strip structure 101 extends is a direction rotated from the m-axis of sapphire by 3° around the c-axis of sapphire. FIG. 19 shows SEM images of the GaN grown on the sapphire substrate. GaN is grown into a truncated parallelogram with the inclined m-planes as four facet planes and a space among the facets is not filled with GaN.

Therefore, the second direction in which the second stripe structure extends must be the a-axis of sapphire or a direction rotated from the a-axis as a reference within a range of 0° to 10° around the c-axis of sapphire. That is, an angle between the second lateral vector and a projected vector of the m-axis of sapphire falls within a range of 0° to 10°. When the second direction is a direction rotated from the a-axis as a reference within a range of 0° to 10° around the c-axis, good lateral growth of GaN is observed. Thus, by the above combination of the crystal axis orientations, when the first direction in which the first stripe structure 100 extends is a crystal orientation rotated from the m-axis of sapphire within a range of 0.5° to 6° around the c-axis of sapphire, and the second direction in which the second stripe structure 101 extends is a crystal orientation rotated from the a-axis of sapphire within a range of 0° to 10° around the c-axis of sapphire, a flat GaN with a low threading dislocation density, that is, uniformly distributed threading dislocations, is obtained.

Embodiment 2

Figure 2:
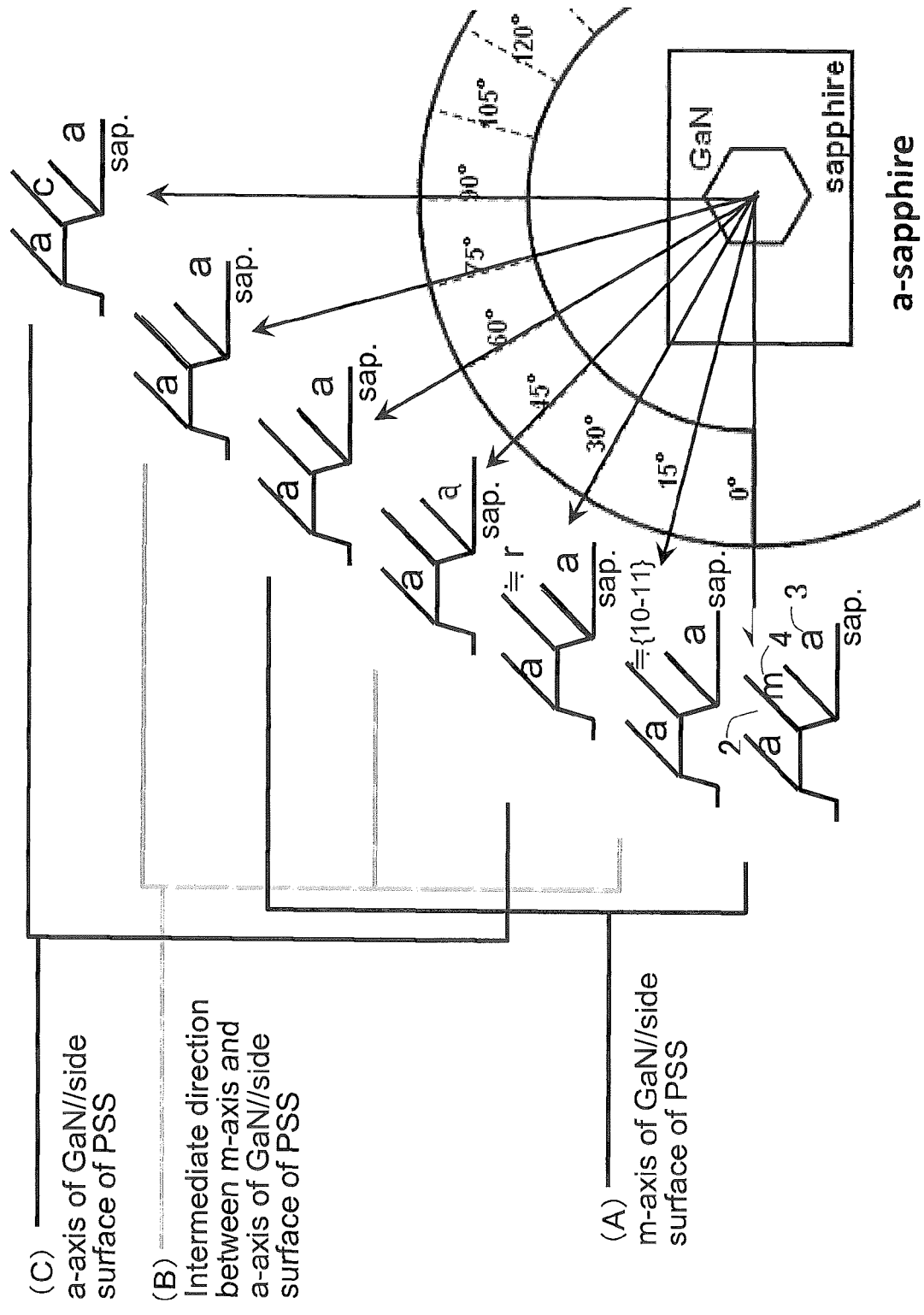
FIG. 2 is a graphical illustration showing a relationship between the processed side surface and the stripe direction in the method for growing GaN by forming posts and trenches with their stripe direction sequentially and continuously changed on a sapphire substrate having an a-plane main surface in Embodiment 2.

Next will be described the case where GaN crystals were grown on a sapphire substrate having an a-plane main surface. In the present embodiment as well, the processed side surface is considered as perpendicular to the main surface of the substrate for ease of explanation. As shown in FIG. 2, posts 2 and trenches 3 were radially formed at an interval angle of 0.01° on the main surface of sapphire. In FIG. 2, when the stripe direction of the post 2 is in a direction of 0° to the baseline of the sapphire substrate, the side surface 4 of the post 2 is the m-plane of sapphire (the lateral vector is the m-axis). When the stripe direction of the post 2 is in a direction of 90° to the baseline of the sapphire substrate, the side surface 4 of the post 2 is the c-plane of sapphire (the lateral vector is the c-axis). When the stripe direction is in an intermediate direction of 30° between 0° and 90°, the side surface 4 of the post 2 is a plane close to the r-plane (−1012) of sapphire (the lateral vector is the r-axis). However, in other directions, the plane perpendicular to the lateral vector of the side surface 4 of the post 2 is a plane rotated from the m-plane of sapphire around the a-axis.

Figure 3B:
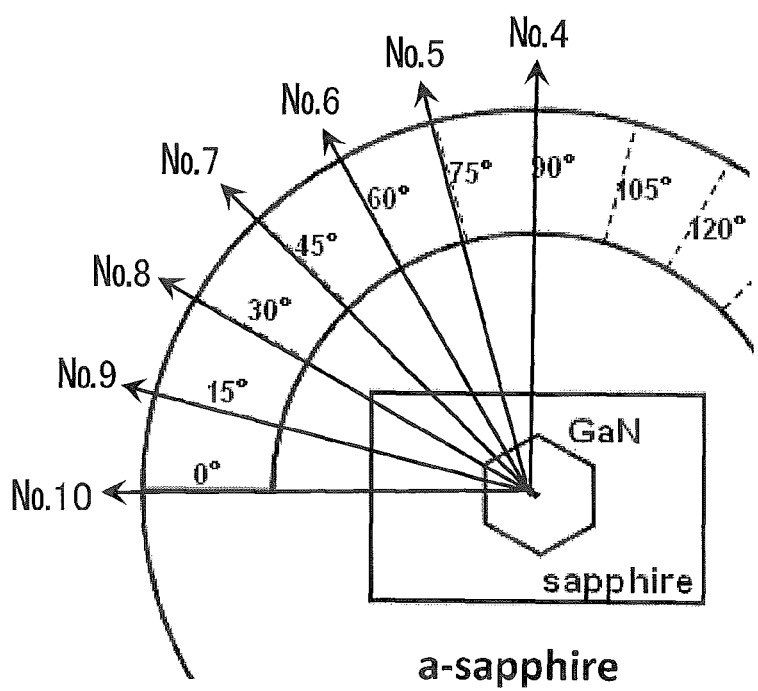
FIG. 3B is a graphical illustration showing a relationship between the stripe direction and the sample in Embodiment 2.

FIG. 4 shows SEM images of the cross sections perpendicular to the stripe direction at an initial stage of GaN growth when the post stripe directions shown in FIG. 3B are No. 4 (the side surface of the post is the c-plane of sapphire) to No. 10 (the side surface of the post is the m-plane of sapphire). FIG. 5 shows SEM images of the cross sections perpendicular to the stripe direction when GaN was grown to a thickness of 5 μm.

In the case of No. 4, that is, when the side surface 4 of the post 2 is the c-plane of sapphire (the lateral vector is the c-axis), GaN is laterally grown on the side surface 4 and GaN is facet grown on the top surface of the post 2 and the bottom surface of the trench 3 so that the cross section perpendicular to the stripe direction is triangle-shaped. When the stripe direction of the post 2 is 30°, that is, when the side surface 4 of the post 2 is a plane close to the r-plane (-1012) (the lateral vector is the r-axis), GaN is facet grown on the top surface of the post 2, but GaN is evenly and vertically grown on the bottom surface of the trench 3. In the case of other directions, there is no dominant lateral growth of GaN on the side surface 4 of the post 2, and no GaN facet growth is observed.

As is clear from FIG. 5, when the stripe direction is No. 4, that is, the side surface 4 of the post 2 is the c-plane of sapphire (the lateral vector is the c-axis), GaN is facet grown so that the cross section perpendicular to the stripe direction is triangle-shaped, and a space among the facets is not filled with GaN. Moreover, in the case of No. 5 to No. 10, no GaN facet growth is observed, and the density of the threading dislocation extending in a vertical direction is high. However, the GaN surface is flat.

From the above, when the posts 2 and the trenches 3 were formed on the sapphire substrate having an a-plane main surface, in the case where the side surface 4 of the post 2 is the c-plane of sapphire (the lateral vector is the c-axis), the plane of the growing GaN which is perpendicular to the lateral vector of the side surface 4 of the post 2 is the m-plane of GaN. Therefore, GaN is facet grown on the top surfaces of the posts and the bottom surfaces of the trenches, and a space among the facets is not filled with GaN. This is the same as when the side surface of the post is the a-plane of sapphire in GaN growth on a c-plane main surface of the sapphire substrate. Therefore, as in Embodiment 1, when an angle between the lateral vector obtained by orthogonally projecting the normal vector of the processed side surface to the main surface of the substrate and the c-axis projected vector obtained by orthogonally projecting the normal vector of sapphire c-plane (0001) to the main surface of the substrate falls within a range of 0.5° to 6°, the threading dislocation density can be reduced and the surface of the grown GaN can be smooth. Such varying the angle θ in the range of 0.5° to 6° is equivalent to that a plane rotated from the c-plane in the range of 0.5° to 6° around the a-axis, when the side surface of the post is completely perpendicular to the main surface of the substrate, is considered as the side surface of the post. In the case of a sapphire substrate having an a-plane main surface, the present invention can also be applied to a general Group III nitride semiconductor, as in Embodiment 1.

Figure 20:
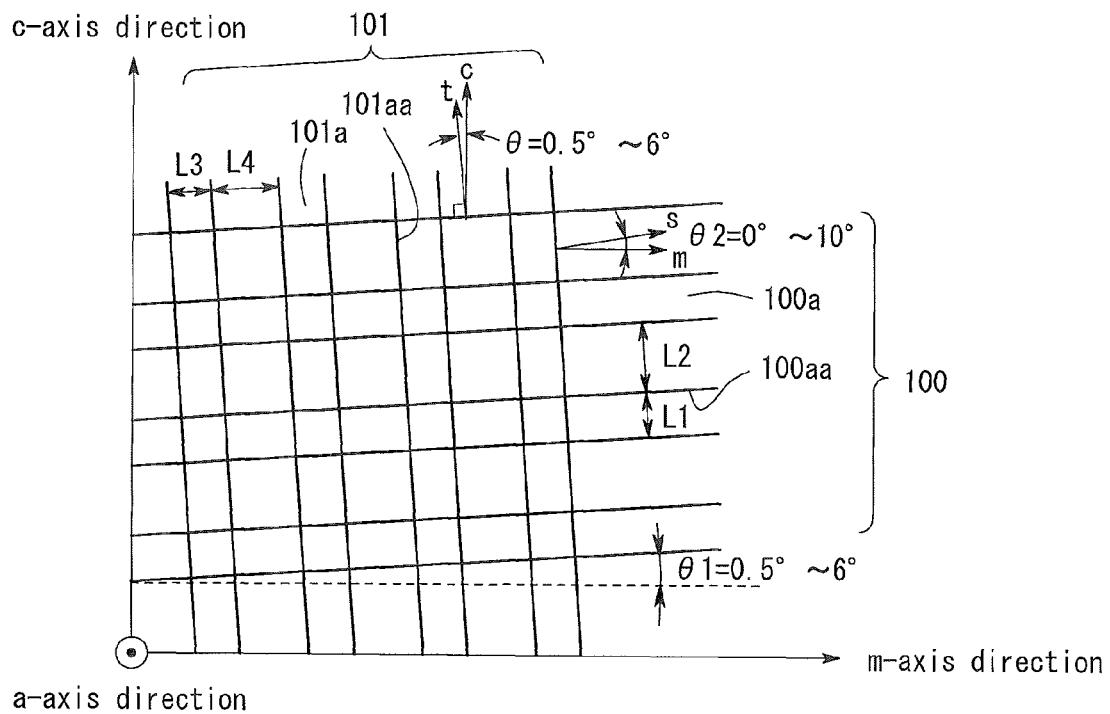
FIG. 20 is a graphical illustration showing a relationship of crystal orientation between the first stripe structure and the second stripe structure according to Embodiment 2.

From the above, as shown in FIG. 20, in the concave-convex structure, the first angle θ1 between the first lateral vector t of the first groove 100a in the first stripe structure 100 and the c-axis projected vector obtained by orthogonally projecting the normal vector of the hexagonal crystal c-plane (0001) of the substrate to the main surface may be from 0.5° to 6°, and the second angle θ2 between the second lateral vector s of the second groove 101a in the second stripe structure 101 and the m-axis projected vector obtained by orthogonally projecting the normal vector of the hexagonal crystal m-plane (10-10) of the substrate to the main surface may be from 0° to 10°.

In the present embodiment as well, the substrate has a thickness of 500 μm, and sputtering was performed at a substrate temperature of 500° C. using high-purity aluminum and nitrogen as raw materials in a magnetron sputter system, thereby forming an AlN buffer layer having a thickness of 10 nm to 30 nm. Next, on the surface of the sapphire substrate on which the concave-convex shape was formed, a GaN layer having a c-plane main surface was grown via the buffer layer to a thickness of 5 μm on the top surfaces of the posts and the bottom surfaces of the trenches by MOCVD. In this case, the m-plane of the GaN growing in the c-axis direction being the vertical direction is parallel to the c-plane of sapphire. Since the first angle θ1 between the first lateral vector t of the first processed side surface 100aa and the sapphire c-axis projected vector is from 0.5° to 6°, the plane of the growing GaN which is perpendicular to the first lateral vector t is a plane rotated from the m-plane of GaN within a range of 0.5° to 6° around the c-axis of GaN.

As a result, the normal vector of the a-plane of GaN has a component in a direction of the first lateral vector t. Therefore, GaN is grown in a direction parallel to the main surface as well as facet grown so that a space among the facets is filled in. Thus, a flat and smooth GaN with a low threading dislocation density can be obtained. In the second stripe structure 101, the second angle θ2 between the second lateral vector s of the second processed side surface 101aa of the second groove 101a and the m-axis projected vector of the sapphire is from 0° to 10°. The a-plane of the growing GaN is parallel to the m-plane of sapphire.

Therefore, the side surface of the growing GaN which is perpendicular to the second lateral vector s is a plane rotated from the a-plane of GaN within a range of 0° to 10° around the c-axis. As a result, the second lateral vector s has a larger component in the a-axis direction of GaN, and thus increasing the growth rate of GaN in a direction of the second lateral vector s and filling in a space among the facets. Thus, based on the same principle of Embodiment 1, a semiconductor having a flat grown surface of Group III nitride semiconductor, in which threading dislocations are uniformly distributed and the average threading dislocation density is reduced, is obtained.

Embodiment 3

Figure 21:
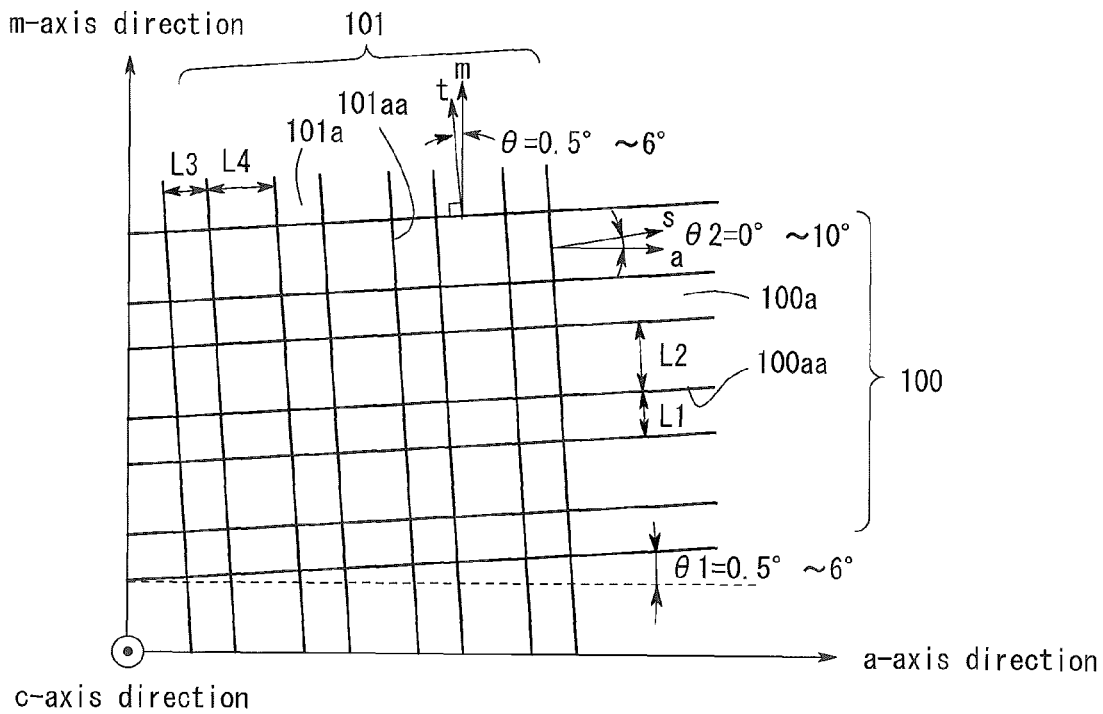
FIG. 21 is a graphical illustration showing a relationship of crystal orientation between the first stripe structure and the second stripe structure according to Embodiment 3.

This embodiment is an example using a Group III nitride semiconductor substrate instead of a sapphire substrate in Embodiments 1 and 2. In this case, as shown in FIG. 21, the main surface of the substrate is a c-plane. A concave-convex structure was formed so that the first angle θ1 between the first lateral vector t of the first processed side surface 100aa of the first stripe structure 100 on the substrate and the m-axis projected vector m obtained by orthogonally projecting the normal vector of the m-plane to the main surface of the substrate is from 0.5° to 6°, and the second angle θ2 between the second lateral vector s of the second processed side surface 101aa of the second stripe structure 101 and the a-axis projected vector a obtained by orthogonally projecting the normal vector of the a-plane to the main surface of the substrate is from 0° to 10°.

In this case, the Group III nitride semiconductor substrate is grown in the c-axis direction on the top surfaces of the posts and the bottom surfaces of the trenches. The m-plane of the substrate is parallel to the m-plane of the growing Group III nitride semiconductor substrate, and the a-plane of the substrate is parallel to the a-plane of the growing Group III nitride semiconductor substrate. Since the first angle θ1 between the first lateral vector t of the first processed side surface 100aa and the m-axis projected vector of the Group III nitride semiconductor substrate is from 0.5° to 6°, the plane of the growing GaN which is perpendicular to the first lateral vector t is a plane rotated from the m-plane of GaN within a range of 0.5° to 6° around the c-axis of GaN. As a result, the normal vector of the a-plane of GaN has a component in a direction of the first lateral vector t. Therefore, GaN is grown in a direction parallel to the main surface as well as facet grown so that a space among the facets is filled in. Thus, a flat and smooth GaN with a low threading dislocation density can be obtained.

Moreover, in the second stripe structure 101, the second angle θ2 between the second lateral vector s of the second processed side surface 101aa of the second groove 101a and the a-axis projected vector is from 0° to 10°. Therefore, the side surface of the growing GaN which is perpendicular to the second lateral vector s is a plane rotated from the a-plane of GaN within a range of 0° to 10° around the c-axis. As a result, the second lateral vector s has a larger component in the a-axis direction of GaN, and thus increasing the growth rate of GaN in a direction of the second lateral vector s and filling in a space among the facets. Thus, based on the same principle of Embodiment 1, a semiconductor having a flat grown surface of Group III nitride semiconductor, in which threading dislocations are uniformly distributed and the average threading dislocation density is reduced, is obtained.

The present invention can also be practiced by using a template substrate in which a GaN or other Group III nitride semiconductor layer was epitaxially grown on a sapphire substrate and forming a similar concave-convex structure on the Group III nitride semiconductor layer. Moreover, the present invention can be practiced by using a template substrate in which a GaN or other Group III nitride semiconductor layer was epitaxially grown on an AlN substrate.

Embodiment 4

Figure 22:
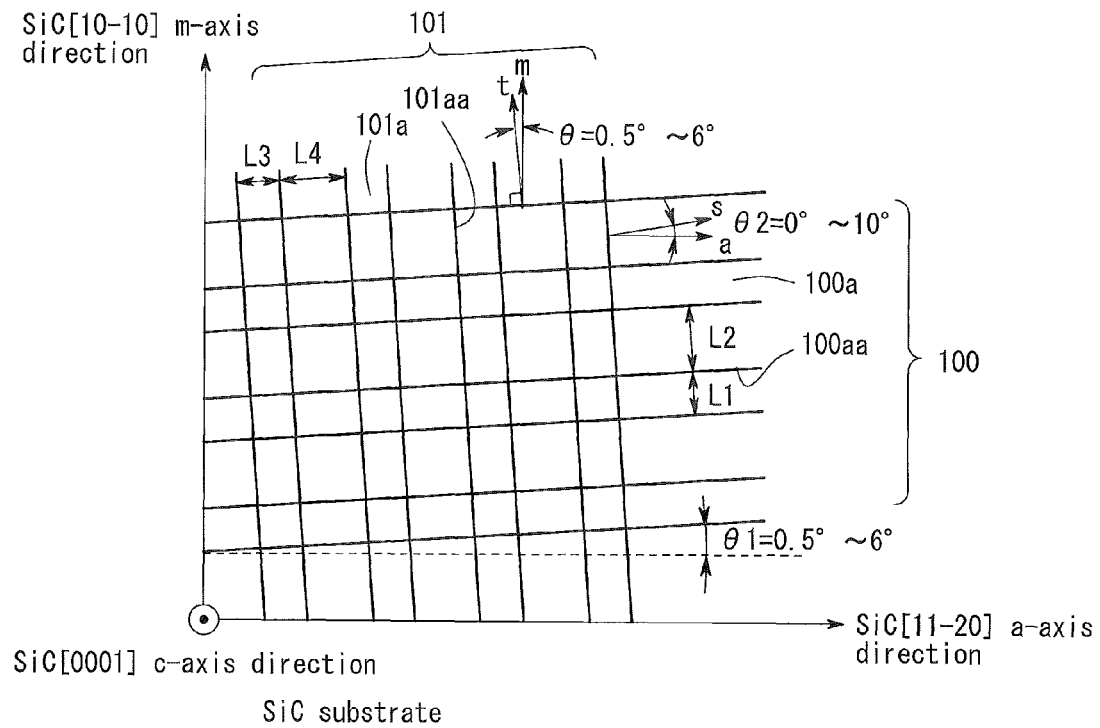
FIG. 22 is a graphical illustration showing a relationship of crystal orientation between the first stripe structure and the second stripe structure according to Embodiment 4.

This embodiment is an example using a Silicon Carbide (SiC) substrate instead of a sapphire substrate in Embodiments 1 and 2. In this case, as shown in FIG. 22, the main surface of the substrate is a c-plane (0001). A concave-convex structure was formed so that the first angle θ1 between the first lateral vector t of the first processed side surface 100aa of the first stripe structure 100 on the substrate and the m-axis projected vector m obtained by orthogonally projecting the normal vector of the m-plane (10-10) to the main surface of the substrate is from 0.5° to 6°, and the second angle θ2 between the second lateral vector s of the second processed side surface 101aa of the second stripe structure 101 and the a-axis projected vector a obtained by orthogonally projecting the normal vector of the a-plane (11-20) to the main surface of the substrate is from 0° to 10°.

In this case, the Group III nitride semiconductor substrate is grown in the c-axis direction on the top surfaces of the posts and the bottom surfaces of the trenches. A relationship between the crystal orientation of the hexagonal crystal silicon carbide (SiC) and the crystal orientation of the hexagonal crystal Group III nitride semiconductor grown on the SiC is such that the m-plane (10-10) of the substrate is parallel to the m-plane of the growing Group III nitride semiconductor, and the a-plane (11-20) of the substrate is parallel to the a-plane of the growing Group III nitride semiconductor. Unlike the relationship between the crystal orientation of the sapphire substrate and the crystal orientation of the Group III nitride semiconductor, the crystal orientations of the substrate and the growing Group III nitride semiconductor are the same because the lattice constant of the Group III nitride semiconductor is closer to that of SiC than that of sapphire.

Since the first angle θ1 between the first lateral vector t of the first processed side surface 100*aa* and the m-axis [10-10] projected vector of the silicon carbide (SiC) substrate is from 0.5° to 6°, the plane of the growing GaN which is perpendicular to the first lateral vector t is a plane rotated from the m-plane of GaN within a range of 0.5° to 6° around the c-axis of GaN. As a result, the normal vector of the a-plane of GaN has a component in a direction of the first lateral vector t. Therefore, GaN is grown in a direction parallel to the main surface as well as facet grown so that a space among the facets is filled in. Thus, a flat and smooth GaN with a low threading dislocation density can be obtained.

Moreover, in the second stripe structure 101, the second angle θ2 between the second lateral vector s of the second processed side surface 101*aa* of the second groove 101*a* and the a-axis [11-20] projected vector of the silicon carbide (SiC) substrate is from 0° to 10°. Therefore, the side surface of the growing GaN which is perpendicular to the second lateral vector s is a plane rotated from the a-plane of GaN within a range of 0° to 10° around the c-axis of GaN. As a result, the second lateral vector s has a larger component in the a-axis direction of GaN, and thus increasing the growth rate of GaN in a direction of the second lateral vector s and filling in a space among the facets. Based on the same principle of Embodiment 1, a semiconductor having a flat grown surface of Group III nitride semiconductor, in which threading dislocations are uniformly distributed and the average threading dislocation density is reduced, is obtained.

Embodiment 5

Figure 23:
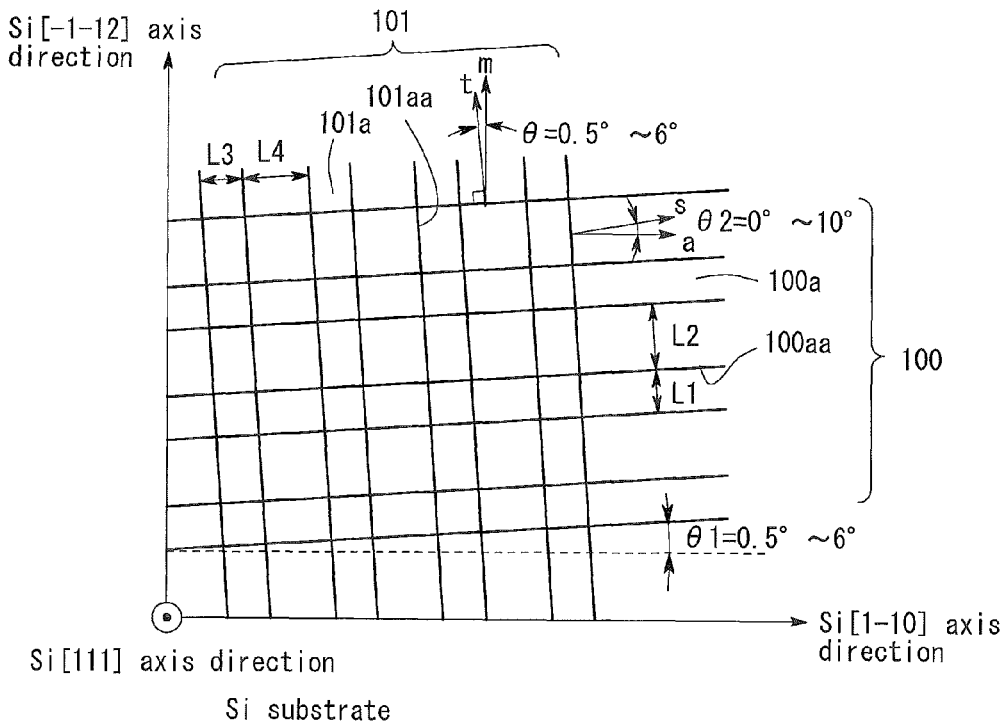
FIG. 23 is a graphical illustration showing a relationship of crystal orientation between the first stripe structure and the second stripe structure according to Embodiment 5.

This embodiment is an example using a cubic crystal silicon (Si) substrate instead of a sapphire substrate in Embodiments 1 and 2. In this case, as shown in FIG. 23, the main surface of the substrate is a (111) plane of Si. A concave-convex structure was formed so that the first angle θ1 between the first lateral vector t of the first processed side surface 100*aa* of the first stripe structure 100 on the substrate and the Si [-1-12] axis projected vector m obtained by orthogonally projecting the normal vector of the (-1-12) plane of Si to the main surface of the substrate is from 0.5° to 6°, and the second angle θ2 between the second lateral vector s of the second processed side surface 101*aa* of the second stripe structure 101 and the Si [1-10] axis projected vector a obtained by orthogonally projecting a normal vector of the (1-10) plane to the main surface of the substrate is from 0° to 10°.

In this case, the Group III nitride semiconductor substrate is grown in the c-axis direction on the top surfaces of the posts and the bottom surfaces of the trenches. A relationship between the crystal orientation of cubic crystal silicon (Si) and the crystal orientation of hexagonal crystal Group III nitride semiconductor grown on the Si is such that the (111) plane of Si is parallel to the c-plane (0001) of the growing Group III nitride semiconductor, the (-1-12) plane of Si is parallel to the m-plane (10-10) of the growing Group III nitride semiconductor, and the (1-10) plane of Si is parallel to the a-plane (11-20) of the growing Group III nitride semiconductor.

Since the first angle θ1 between the first lateral vector t of the first processed side surface 100*aa* and the silicon (Si) [-1-12] axis projected vector is from 0.5° to 6°, the plane of the growing GaN which is perpendicular to the first lateral vector t is a plane rotated from the m-plane of GaN within a range of 0.5° to 6° around the c-axis of GaN. As a result, the normal vector of the a-plane of GaN has a component in a direction of the first lateral vector t. Therefore, GaN is grown in a direction parallel to the main surface as well as facet grown so that a space among the facets is filled in. Thus, a flat and smooth GaN with a low threading dislocation density can be obtained.

Moreover, in the second stripe structure 101, the second angle θ2 between the second lateral vector s of the second processed side surface 101*aa* of the second groove 101*a* and the silicon (Si) [1-10] axis projected vector is from 0° to 10°. Therefore, the side surface of the growing GaN which is perpendicular to the second lateral vector s is a plane rotated from the a-plane of GaN within a range of 0° to 10° around the c-axis of GaN. As a result, the second lateral vector s has a larger component in the a-axis direction of GaN, and thus increasing the growth rate of GaN in a direction of the second lateral vector s and filling in a space among the facets. Based on the same principle of Embodiment 1, a semiconductor having a flat grown surface of Group III nitride semiconductor, in which threading dislocations are uniformly distributed and the average threading dislocation density is reduced, is obtained.

In Embodiments 1 to 6, the second stripe structure is formed before formation of the first stripe structure. However, the first stripe structure may be formed first, and then second stripe structure may be formed by etching the first stripe structure. They may be formed in any order. In Embodiments 1 and 2, the buffer layer is formed of AlN, but is not limited to this as long as it is formed of $Al_xGa_yN$ (x+y=1, 0≤x, y≤1). The buffer layer may be a single layer or may comprise a plurality of layers. The buffer layer is formed by the sputtering method, but the buffer layer may be formed by MOCVD.

Here, the notation of the Miller indices represents a set of equivalent planes or a set of equivalent axes. For example, m-plane (10-10) represents a set of (10-10), (1-100), (-1100), (-1010), (01-10), and (0-110) planes. M-axis [10-10] represents a set of [10-10], [1-100], [-1100], [-1010], [01-10], and [0-110] axes. A-plane (11-20), a-axis [11-20], cubic crystal (-1-12) plane, (1-10) plane, [-1-12] axis, and [1-10] axis similarly represent a set of equivalent planes or equivalent axes.

The present invention can be applied to the method for producing a Group III nitride semiconductor light-emitting device.

What is claimed is:
1. A method for producing a Group III nitride semiconductor comprising:
    forming a concave-convex structure including posts and trenches on a main surface of a substrate; and
    growing Group III nitride semiconductor in a c-axis direction of the Group III nitride semiconductor on top surfaces of the posts and bottom surfaces of the trenches;
    wherein in the forming of the concave-convex structure, a first stripe structure and a second stripe structure, the first stripe structure including a plurality of first grooves which are arranged in a stripe pattern as viewed from above and are aligned parallel to a first direction, the second stripe structure including a plurality of second grooves which are arranged in a stripe pattern as viewed from above and are aligned parallel to a second direction crossing the first direction, are formed on the main surface of the substrate so that a difference in level is provided by a depth of the second grooves in the first grooves and a difference in level is provided by a depth of the first grooves in the second grooves, wherein a first processed side surface, which is a side surface of the post or the trench of the first stripe structure, is formed to have a crystal orientation satisfying following conditions:

a plane which is most parallel to the first processed side surface, among low-index planes of the growing Group III nitride semiconductor, is a m-plane (10-10) of the growing Group III nitride semiconductor; and when a projected vector obtained by orthogonally projecting a normal vector of the first processed side surface to the main surface of the substrate is defined as a first lateral vector, a first angle between the first lateral vector and an m-axis projected vector obtained by orthogonally projecting a normal vector of the m-plane of the growing Group III nitride semiconductor to the main surface is from 0.5° to 6°, and wherein a second processed side surface, which is a side surface of the post or the trench of the second stripe structure, is formed to have a crystal orientation satisfying following conditions:

a plane which is most parallel to the second processed side surface, among low-index planes of the growing Group III nitride semiconductor, is an a-plane (11-20) of the growing Group III nitride semiconductor; and when a projected vector obtained by orthogonally projecting a normal vector of the second processed side surface to the main surface is defined as a second lateral vector, a second angle between the second lateral vector and an a-axis projected vector obtained by orthogonally projecting a normal vector of the a-plane of the growing Group III nitride semiconductor to the main surface is from 0° to 10°.

2. The method for producing the Group III nitride semiconductor according to claim 1, wherein:

the substrate has a hexagonal crystal structure, the main surface of the substrate is a c-plane (0001) of a hexagonal crystal;

the first angle is an angle between the first lateral vector and an a-axis projected vector obtained by orthogonally projecting a normal vector of an a-plane (11-20), which is parallel to the m-plane (10-10) of the growing Group III nitride semiconductor, of the hexagonal crystal of the substrate to the main surface; and the second angle is an angle between the second lateral vector and an m-axis projected vector obtained by orthogonally projecting a normal vector of an m-plane (10-10), which is parallel to the a-plane (11-20) of the growing Group III nitride semiconductor, of the hexagonal crystal of the substrate to the main surface.

3. The method for producing the Group III nitride semiconductor according to claim 1, wherein the substrate has a hexagonal crystal structure, the main surface of the substrate is an a-plane (11-20) of a hexagonal crystal;

the first angle is an angle between the first lateral vector and a c-axis projected vector obtained by orthogonally projecting a normal vector of a c-plane (0001), which is parallel to the m-plane (10-10) of the growing Group III nitride semiconductor, of the hexagonal crystal of the substrate to the main surface; and the second angle is an angle between the second lateral vector and an m-axis projected vector obtained by orthogonally projecting a normal vector of a m-plane (10-10), which is parallel to the a-plane (11-20) of the growing Group III nitride semiconductor, of the hexagonal crystal of the substrate to the main surface.

4. The method for producing the Group III nitride semiconductor according to claim 1, wherein a portion on which the concave-convex structure is formed comprises a Group III nitride semiconductor as the substrate;

the main surface of the substrate is a c-plane (0001) of the Group III nitride semiconductor as the substrate;

the first angle is an angle between the first lateral vector and an m-axis projected vector obtained by orthogonally projecting a normal vector of an m-plane (10-10), which is parallel to the m-plane (10-10) of the growing Group III nitride semiconductor, of the Group III nitride semiconductor as the substrate to the main surface; and the second angle is an angle between the second lateral vector and an a-axis projected vector obtained by orthogonally projecting a normal vector of an a-plane (11-20), which is parallel to the a-plane (11-20) of the growing Group III nitride semiconductor, of the Group III nitride semiconductor as the substrate to the main surface.

5. The method for producing a Group III nitride semiconductor according to claim 2, wherein the substrate comprises a sapphire substrate.

6. The method for producing a Group III nitride semiconductor according to claim 3, wherein the substrate comprises a sapphire substrate.

7. The method for producing the Group III nitride semiconductor according to claim 1, wherein a portion on which the concave-convex structure is formed comprises a silicon carbide (SiC) as the substrate;

a main surface of the substrate is a c-plane (0001) of the silicon carbide (SiC);

the first angle is an angle between the first lateral vector and an m-axis projected vector obtained by orthogonally projecting a normal vector of an m-plane (10-10), which is parallel to the m-plane (10-10) of the growing Group III nitride semiconductor, of the silicon carbide (SiC) as the substrate to the main surface; and the second angle is an angle between the second lateral vector and an a-axis projected vector obtained by orthogonally projecting a normal vector of an a-plane (11-20), which is parallel to the a-plane (11-20) of the growing Group III nitride semiconductor, of the silicon carbide (SiC) as the substrate to the main surface.

8. The method for producing the Group III nitride semiconductor according to claim 1, wherein:

a portion on which the concave-convex structure is formed comprises a silicon (Si) as the substrate;

the main surface of the substrate is a plane (111) of the silicon (Si);

the first angle is an angle between the first lateral vector and a Si [-1-12] axis projected vector obtained by orthogonally projecting a normal vector of a (-1-12) plane, which is parallel to the m-plane (10-10) of the growing Group III nitride semiconductor, of the silicon (Si) as the substrate to the main surface; and the second angle is an angle between the second lateral vector and a Si [1-10] axis projected vector obtained by orthogonally projecting a normal vector of a (1-10) plan; which is parallel to the a-plane (11-20) of the growing Group III nitride semiconductor, of the silicon (Si) as the substrate to the main surface.

9. The method for producing the Group III nitride semiconductor according to claim 1, wherein the first angle is from 1° to 2.5°.

10. The method for producing the Group III nitride semiconductor according to claim 1, wherein the depth of the first grooves is different from the depth of the second grooves.

11. A Group III nitride semiconductor having a substrate with a concave-convex structure including posts and trenches formed on a main surface thereof, and grown on the top surfaces of the posts and the bottom surfaces of the trenches in a c-axis direction of the Group III nitride semiconductor,
wherein the concave-convex structure comprises a first stripe structure and a second stripe structure, the first stripe structure including a plurality of first grooves which are arranged in a stripe pattern as viewed from above and are aligned parallel to a first direction, the second stripe structure including a plurality of second grooves which are arranged in a stripe pattern as viewed from above and are aligned parallel to a second direction crossing the first direction, formed on the main surface of the substrate so that a difference in level is provided by the depth of the second grooves in the first grooves and a difference in level is provided by the depth of the first grooves in the second grooves,
wherein a first processed side surface, which is a side surface of the post or the trench of the first stripe structure, has a crystal orientation satisfying following conditions:
a plane which is most parallel to the first processed side surface among low-index planes of the growing Group III nitride semiconductor, is a m-plane (10-10) of the growing Group III nitride semiconductor; and
when a projected vector obtained by orthogonally projecting a normal vector of the first processed side surface to the main surface of the substrate is defined as a first lateral vector, a first angle between the first lateral vector and an m-axis projected vector obtained by orthogonally projecting a normal vector of the m-plane of the growing Group III nitride semiconductor to the main surface is from 0.5° to 6°, and
wherein a second processed side surface which is a side surface of the post or the trench of the second stripe structure, has a crystal orientation satisfying the following conditions:
a plane which is most parallel to the second processed side surface, among low-index planes of the growing Group III nitride semiconductor, is an a-plane (11-20) of the growing Group III nitride semiconductor; and
when a projected vector obtained by orthogonally projecting a normal vector of the second processed side surface to the main surface is defined as a second lateral vector, a second angle between the second lateral vector and an a-axis projected vector obtained by orthogonally projecting a normal vector of the a-plane of the growing Group III nitride semiconductor to the main surface is from 0° to 10°.

12. The Group III nitride semiconductor according to claim 11, wherein:
the substrate has a hexagonal crystal structure, the main surface of the substrate is a c-plane (0001) of a hexagonal crystal;
the first angle is an angle between the first lateral vector and an a-axis projected vector obtained by orthogonally projecting a normal vector of an a-plane (11-20), which is parallel to the m-plane (10-10) of the growing Group III nitride semiconductor, of the hexagonal crystal of the substrate to the main surface; and
the second angle is an angle between the second lateral vector and an m-axis projected vector obtained by orthogonally projecting a normal vector of a m-plane (10-10), which is parallel to the a-plane (11-20) of the growing Group III nitride semiconductor, of the hexagonal crystal of the substrate to the main surface.

13. The Group III nitride semiconductor according to claim 11, wherein
the substrate has a hexagonal crystal structure, the main surface of the substrate is an a-plane (11-20) of a hexagonal crystal;
the first angle is an angle between the first lateral vector and a c-axis projected vector obtained by orthogonally projecting a normal vector of a c-plane (0001), which is parallel to the m-plane (10-10) of the growing Group III nitride semiconductor, of the hexagonal crystal of the substrate to the main surface; and
the second angle is an angle between the second lateral vector and an m-axis projected vector obtained by orthogonally projecting a normal vector of a m-plane (10-10), which is parallel to the a-plane (11-20) of the growing Group III nitride semiconductor, of the hexagonal crystal of the substrate to the main surface.

14. The Group III nitride semiconductor according to claim 11, wherein
a portion on which the concave-convex structure is formed comprises a Group III nitride semiconductor as the substrate;
the main surface of the substrate is a c-plane (0001) of the Group III nitride semiconductor as the substrate;
the first angle is an angle between the first lateral vector and an m-axis projected vector obtained by orthogonally projecting a normal vector of a m-plane (10-10), which is parallel to the m-plane (10-10) of the growing group III nitride semiconductor, of the Group III nitride semiconductor as the substrate to the main surface; and
the second angle is an angle between the second lateral vector and an a-axis projected vector obtained by orthogonally projecting a normal vector of an a-plane (11-20), which is parallel to the a-plane (11-20) of the growing Group III nitride semiconductor, of the Group III nitride semiconductor as the substrate to the main surface.

15. The Group III nitride semiconductor according to claim 12, wherein the substrate comprises a sapphire substrate.

16. The Group III nitride semiconductor according to claim 13, wherein the substrate comprises a sapphire substrate.

17. The Group III nitride semiconductor according to claim 11, wherein
a portion on which the concave-convex structure is formed comprises a silicon carbide (SiC) as the substrate;
a main surface of the substrate is a c-plane (0001) of the silicon carbide (SiC);
the first angle is an angle between the first lateral vector and an m-axis projected vector obtained by orthogonally projecting a normal vector of a m-plane (10-10), which is parallel to the m-plane (10-10) of the growing Group III nitride semiconductor, of the silicon carbide (SiC) as the substrate to the main surface; and
the second angle is an angle between the second lateral vector and an a-axis projected vector obtained by orthogonally projecting a normal vector of an a-plane (11-20), which is parallel to the a-plane (11-20) of the growing Group III nitride semiconductor, of the silicon carbide (SiC) as the substrate to the main surface.

18. The Group III nitride semiconductor according to claim 11, wherein
a portion on which the concave-convex structure is formed comprises a silicon (Si) as the substrate;

the main surface of the substrate is a plane (111) of the silicon (Si);

the first angle is an angle between the first lateral vector and a Si [-1-12] axis projected vector obtained by orthogonally projecting a normal vector of a (-1-12) plan; which is parallel to the m-plane (10-10) of the growing Group III nitride semiconductor, of the silicon (Si) as the substrate to the main surface; and the second angle is an angle between the second lateral vector and a Si [1-10] axis projected vector obtained by orthogonally projecting a normal vector of a (1-10) plane, which is parallel to the a-plane (11-20) of the growing Group III nitride semiconductor, of the silicon (Si) as the substrate to the main surface.

19. The Group III nitride semiconductor according to claim 11, wherein the first angle is from 1° to 2.5°.

20. The Group III nitride semiconductor according to claim 11, wherein the depth of the first grooves is different from the depth of the second grooves.

* * * * *